United States Patent [19]
Shirai

[11] Patent Number: 5,861,974
[45] Date of Patent: Jan. 19, 1999

[54] TRANSMISSION DEVICE CONNECTED TO OPTICAL TRANSMISSION LINE

[75] Inventor: Katsuhiro Shirai, Kawasaki, Japan

[73] Assignee: Fujitsu Limited, Kawasaki, Japan

[21] Appl. No.: 791,950

[22] Filed: Jan. 31, 1997

[30] Foreign Application Priority Data

Mar. 1, 1996 [JP] Japan ................................ 8-045158
Nov. 14, 1996 [JP] Japan ................................ 8-303346

[51] Int. Cl.⁶ .................................................. H01S 3/00
[52] U.S. Cl. ................................... 359/341; 359/177
[58] Field of Search ............................. 359/341, 161, 359/160, 177

[56] References Cited

U.S. PATENT DOCUMENTS

| | | | |
|---|---|---|---|
| 5,467,219 | 11/1995 | Ushicozawa | 359/341 |
| 5,570,227 | 10/1996 | Nabeyama et al. | 359/341 |
| 5,633,750 | 5/1997 | Nogiwa et al. | 359/341 |
| 5,680,246 | 10/1997 | Takahashi et al. | 359/341 |

*Primary Examiner*—Mark Hellner
*Attorney, Agent, or Firm*—Staas & Halsey

[57] ABSTRACT

A transmission device includes an exciting light source outputting an exciting light, a first optical part which supplies an optical amplifying part with a signal light and the exciting light, a second optical part which supplies an amplified light to an optical transmission line and receives a light received via the optical transmission line, and a control part which determines whether the light received includes the exciting light output by the exciting light source and controls the exciting light source to stop outputting the exciting light.

32 Claims, 41 Drawing Sheets

TRANSMISSION DEVICE CONNECTED TO OPTICAL TRANSMISSION LINE

BACKGROUND OF THE INVENTION

1. Field of the Invention

The present invention generally relates to transmission devices connected to an optical transmission line, and more particularly to a communication device which has the function of amplifying a signal light and communicates with a remote communication device in two ways.

Recently, communications utilizing an optical fiber as a transmission medium have been practically used, and a long-distance signal transfer has been realized. In order to advance such optical communications, it is desired to further improve the light amplifying technique and the two-way communication technique.

2. Description of the Related Art

Nowadays, a transmission device used in an optical communication system is equipped with a light amplifying device which amplifies a light to be transmitted to an optical fiber in order to enable a long-distance light transfer.

FIG. 1 is a block diagram of a conventional light amplifier device 11, which is made up of an exciting light source 12, a wave combiner 13, an optical amplifier 14 of an optical fiber type, and an optical isolator 15. The combiner 13 combines a light to be transmitted and an exciting light from the source 12 together. The optical amplifier 14 optically amplifies the output signal of the combiner 13. The amplified signal light passes through the optical isolator 15, and is output to an optical fiber cable 16.

The optical amplifier 14 is formed of, for example, a rare-earth doped optical fiber, such as an erbium-doped optical fiber. The optical isolator 15 isolates a reflected light from the transmission line in order to prevent the reflected light from being applied to the optical amplifier 14. If the reflected light is applied to the optical amplifier 14, the optical amplifier 14 will oscillate in an unstable state.

The light amplifier device 11 shown in FIG. 1 cannot realize the two-way optical transmission because the optical isolator 15 is connected to the optical fiber cable 16.

A two-way transmission device which has the light amplifying function is disclosed in Japanese Unexamined Publication No. 58-115948 or No. 6-53585. The two-way transmission devices disclosed in the above publications do not use an optical isolator as described above, and thus the light amplifiers equipped therewith may oscillate in the unstable state.

It is possible to modify the structure shown in FIG. 1 in order to enable the two-way optical transmission by positioning the combiner 13 between the optical isolator 15 and the optical fiber cable 16. In this case, a received signal light from the cable 16 bypasses the optical isolator 15 and is applied to a receive part (not shown). However, the above modification has a problem caused when the cable 16 is broken. The amplified light transmitted to the cable 16 from the optical amplifier 14 is reflected by an end surface of the broken part of the cable 16. The reflected light is applied to the receive part, which cannot discriminate whether the received light is a signal light from a remote transmission device or the above reflected light. In other words, the above modification does not have any function of determining whether the received light is a reflected light caused by a break of the cable 16. Further, the reflected light emitted from the end surface of the broken part of the cable 16 has a high energy level, which may damage a maintenance person.

SUMMARY OF THE INVENTION

It is a general object of the present invention to provide a novel and improved transmission device in which the above disadvantages are eliminated.

A more specific object of the present invention is to provide a transmission device capable of detecting a break of an optical fiber cable and thus controlling a transmission of a signal light.

The above objects of the present invention are achieved by a transmission device including: an exciting light source outputting an exciting light; a first optical part which supplies an optical amplifying part with a signal light and the exciting light; a second optical part which supplies an amplified light to an optical transmission line and receives a light received via the optical transmission line; and a control part which determines whether the light received includes the exciting light output by the exciting light source and controls the exciting light source to stop outputting the exciting light.

The transmission device may be configured so that the first optical part is provided at an output side of the optical amplifying part and supplies the exciting light from the exciting light source to the optical amplifying part and the optical transmission line.

The transmission device may be configured so that it further includes: a first part which causes the exciting light source to generate a modulated light signal having a given pattern when it is determined that the light received includes the exciting light and determines whether the light received includes the modulated light signal having the given pattern; and a switch part which supplies the modulated signal to the optical transmission line without supplying the modulated light signal to the optical amplifier part, the first part causing the exciting light source to stop outputting any light when it is determined that the received light includes the modulated light signal having the given pattern.

The transmission device may be configured so that the control part causes the signal light to stop being output to the optical transmission line.

The transmission device may be configured so that it further includes a multiplexer/demultiplexer part which inserts a given pattern into the signal light when it is determined that the light received includes the exciting light and extracts the given pattern from the light received, the control part causing the exciting light source to stop outputting the exciting light when the given pattern is extracted from the light received.

The transmission device may be configured so that it further includes: a first part which causes the exciting light source to vary a magnitude of the exciting light by changing a bias current flowing in the exciting light source when it is determined that the light received includes the exciting light and determines whether the light received includes the exciting light having a level corresponding to a varied magnitude; and the first part causing the exciting light source to stop outputting any light when it is determined that the light received includes the exciting light having the level corresponding to the varied magnitude.

The transmission device may be configured so that the first part is provided at an input side of the optical amplifying part and supplies the exciting light from the exciting light source to the optical amplifying part and the optical transmission line.

The transmission device may be configured so that the first and second parts include respective optical directional couplers.

The transmission device may be configured so that the first part includes an optical directional coupler, and the second part includes a wavelength division multiplexer.

The transmission device may be configured so that the exciting light has a wavelength different from that of the signal light.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
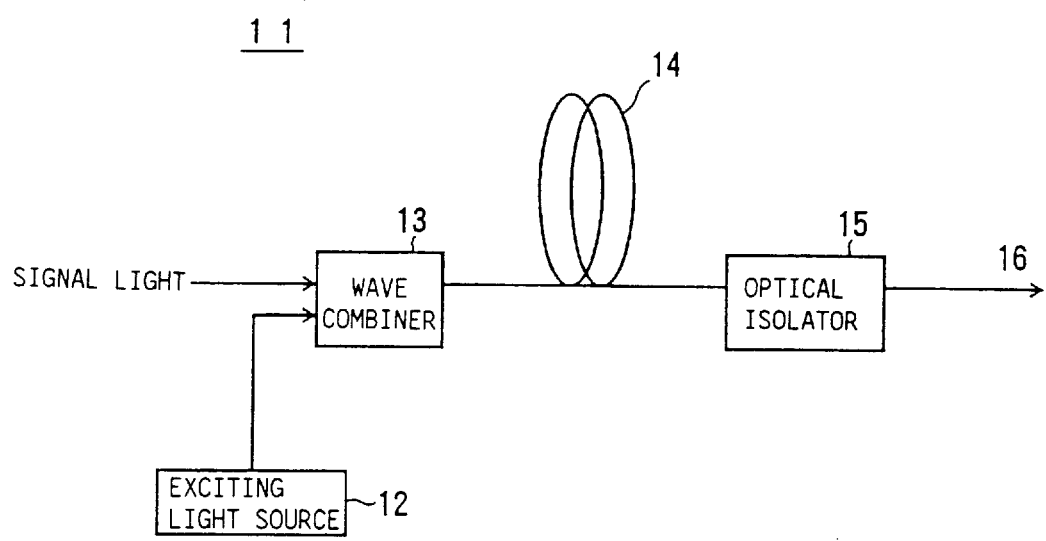
FIG. 1 is a block diagram of a conventional light amplifier device.
Figure 2:
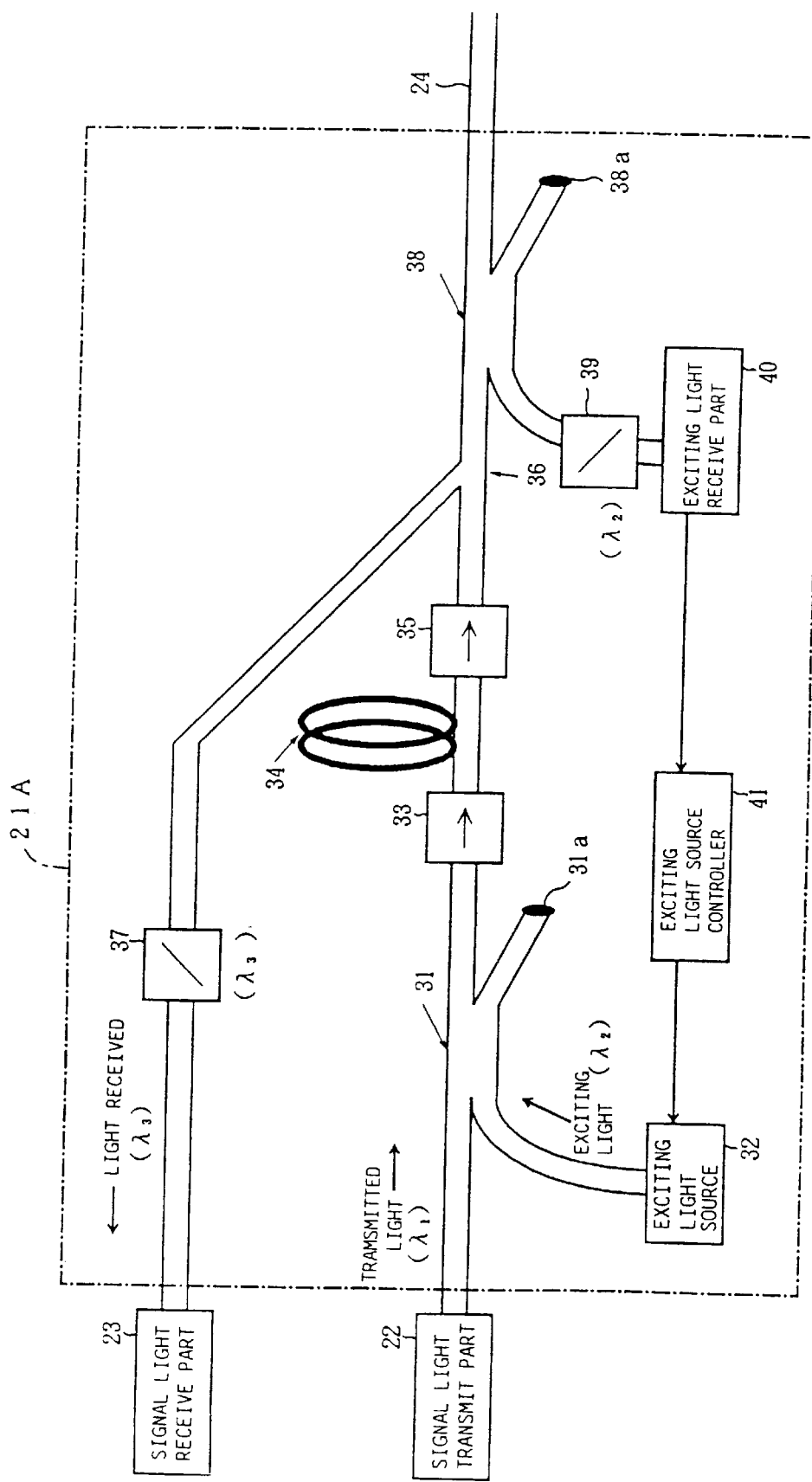
FIG. 2 is a block diagram of a transmission device according to a first embodiment of the present invention.

FIG. 2 is a block diagram of a two-way optical communication device according to a first embodiment of the present invention. The communication device includes a transmission device 21A, which is optically connected to a signal light transmit part 22, a signal light receive part 23, and an optical fiber cable 24. The transmit part 22 has the function of converting an electric signal into a light signal and outputs a modulated light (signal light) to the transmission device 21A. The receive part 23 has the function of converting a light signal into an electric signal and demodulates a received signal light.

The transmission device 21A is configured as follows. A modulated signal light to be transmitted having a wavelength $\lambda_1$ is applied to a first optical directional coupler 31 from the signal light transmit part 22. Also, the first coupler 31 is supplied with an exciting light which is generated by an exciting light source 32 and has a wavelength $\lambda_2$ different from the wavelength $\lambda_1$. The first coupler 31 optically combines the signal light and the exciting light together, and applies the signal light to a first optical isolator 33. The first coupler 31 includes another output to which an optical fiber is connected which has an end surface 31a provided on the output side of the first coupler 31. Matching oil is provided at the end surface 31a.

The signal light outgoing from the first coupler 31 is input to a light amplifier 34 of an optical fiber type, which optically amplifies the signal light. The light amplifier 34 can be formed of a rare-earth doped optical fiber such as an erbium-doped optical fiber. The amplified signal light passes through a second optical isolator 35 and is then input to a second optical directional coupler 36. The light amplifier 34 is sandwiched between the first optical isolator 33 and the second optical isolator 35 and thus prevents the light amplifier 34 from being oscillated due to a reflected light. This allows the first coupler 31 to be positioned on the input side of the light amplifier 34.

The second coupler 36 distributes the signal light from the second optical isolator 35. More particularly, the second coupler 36 applies the signal light to a third optical directional coupler 38 and a second band-pass filter 39. The second band-pass filter 39 allows light having the wavelength $\lambda_2$ to pass therethrough. That is, the signal light having the wavelength $\lambda_1$ cannot pass through the second band-pass filter 39. The third coupler 38 allows the signal light and the exciting light from the second coupler 36 to pass therethrough. The signal light from the third coupler 38 is then applied, together with the exciting light, to the optical fiber cable 24.

Also, the third coupler 38 supplies a light received from the optical fiber cable 24 to a first band-pass filter 37 and the second band-pass filter 39. The first band-pass filter 37 allows light having a wavelength $\lambda_3$ to pass therethrough. The light having the wavelength $\lambda_3$, which differs from the wavelengths $\lambda_1$ and $\lambda_2$, is a signal light transmitted from a remote transmission device. The received signal light is then applied to the signal light receive part 23. The third coupler 38 includes another output to which an optical fiber is connected which has an end surface 38a provided on the output side of the third coupler 38. Matching oil is provided at the end surface 38a. The first and second band-pass filters 37 and 39 can be band-elimination filters.

If the optical fiber cable 24 has a break, the exciting light generated by the exciting light source 32 is reflected by a broken part and is returned to the third coupler 38. The third coupler 38 allows the returned exciting light to be applied to the first and second band-bass filters 37 and 39. The first band-pass filter 37 blocks the returned exciting light because it has the wavelength $\lambda_2$. The second band-pass filter 39 allows the returned exciting light to enter an exciting light receive part 40. When the receive part 40 receives the reflected exciting light having the wavelength $\lambda_2$, it notifies an exciting light source controller 41 of receipt of the reflected exciting light. In response to the above notification, the controller 41 causes the exciting light source 32 not to generate the exciting light.

The operation of the structure shown in FIG. 2 will be described in more detail with reference to FIG. 3, in which the transmit part 22 is denoted as OS and the receive part 23 is denoted as OR.

In a normal state in which the optical fiber cable 24 does not have any problem, the signal light ($\lambda_1$) from the transmit part 22 is combined with the exciting light ($\lambda_2$) from the exciting light source 32 by the first coupler 31, and is then amplified by the light amplifier 34. Then, the amplified signal light and the exciting light pass through the second coupler 36 and the third coupler 38, and then enter the optical fiber cable 24.

The signal light (together with its exciting light) transmitted by a remote transmission device coupled to the optical fiber cable 24 passes through the third coupler 38, and is applied to the second coupler 36 and the second band-pass filter 39. The second coupler 36 supplies the received signal light to the first band-pass filter 37, which allows only the signal light to pass therethrough and omits its exciting light. In the above manner, the two-way transmission can be carried out.

The second band-pass filter 39 allows only the exciting light having the wavelength $\lambda_2$ to pass therethrough, and does not allow the other lights to pass therethrough. Hence, the signal light transmitted by the remote transmission device cannot pass through the second band-pass filter 39. Hence, the exciting light receive part 40 can receive only the exciting light, and can determine whether a break occurs in the optical fiber cable 24 because the exciting light is received when a break occurs therein. Of course, it is necessary that the receive part 40 does not receive any light having the wavelength $\lambda_2$ other than the reflected exciting light.

When the receive part 40 receives the reflected exciting light, it outputs a fault detection signal to the exciting light source controller 41, which then stops outputting the exciting light in response to the fault detection signal. Hence, it is possible to prevent the exciting light having a high energy level from being emitted from the end surface of the broken part of the optical fiber cable 24.

The transmission device 21A can be applied to a station having an existing transmit part 22 and receive part 23 so that the transmission device 21A is placed between the parts 22 and 23 and the optical fiber cable 24. Hence, it is possible to easily realize the two-way transmission device capable of detecting a fault of the optical fiber cable 24.

A description will now be given, with reference to FIG. 4, of a transmission device 21B according to a second embodiment of the present invention. In FIG. 4, parts that are the same as those shown in FIG. 3 are given the same reference numbers. As shown in FIG. 4, a first optical switch 42, a second optical switch 43 and an alarm signal communication circuit 44 are added to the structure shown in FIG. 3. The first optical switch 42 is provided between the exciting light source 32 and the first coupler 31. The first optical switch 42 has an output terminal P1 through which the exciting light having the wavelength $\lambda_2$ is output to the first coupler 31. The second optical switch 43 is provided between the second optical isolator 35 and the second coupler 36, and has an input terminal P1 through which the signal light from the second optical isolator 35 is applied. The first optical switch 42 has a second output terminal P2, which is optically coupled to a second input terminal P2 of the second optical switch 43. The exciting light having the wavelength $\lambda_2$ is also output through the output terminal P2 of the first optical switch 42.

The alarm signal communication circuit 44 is provided between the exciting light receive part 40 and the exciting light source controller 41. The alarm signal communication circuit 44 generates an alarm signal having a given pattern and detects the reflected alarm signal reflected by an end surface of a broken part of the optical fiber cable 24. Further, the alarm signal communication circuit 44 controls the first optical switch 42 and the second optical switch 43 so that these switches select the terminals P2 when generating the alarm signal. In the normal state, the first and second switches 42 and 43 select the terminals P1.

In the normal state, the signal light having the wavelength $\lambda_1$ from the transmit part 22 is combined with the exciting light having the wavelength $\lambda_2$ supplied from the exciting light source 32 through the output terminal P1 of the first optical switch 42, and is then amplified by the optical amplifier 34. The amplified signal light passes through the second optical switch 43, the second coupler 36 and the third coupler 38, and is applied to the optical fiber cable 24. In this manner, the signal light having the wavelength $\lambda_1$ and the exciting light having the wavelength $\lambda_2$ are sent to a remote transmission device.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the alarm signal communication circuit 44. In response to the fault detection signal, the alarm signal communication circuit 44 causes the first and second switches 42 and 43 to select the terminals P2, and outputs the alarm signal having the given pattern to the exciting light source controller 41. Then, the controller 41 modulates the exciting light source 32 by the given pattern of the alarm signal. The modulated exciting light passes through the output terminal P2 of the first optical switch 42 and is applied to the input terminal P2 of the second optical switch 43.

Then, the modulated exciting light passes through the second coupler 36 and the third coupler 38, and is applied to the optical fiber cable 24. The modulated exciting light is then reflected by the broken part of the cable 24 and is returned to the third coupler 38. The modulated exciting light passes through the second band-pass filter 39, and is applied to the exciting light receive part 40. Then, the exciting light receive part 40 outputs a corresponding electric signal to the alarm signal communication circuit 44. The circuit 44 compares the pattern used to modulate the exciting light with the pattern contained in the received signal from the receive part 40, and makes a decision as to whether the patterns coincide with each other. If it is determined that the patterns coincide with each other, the alarm signal communication circuit 44 controls the exciting light source controller 41 so that the exciting light source 32 stops outputting the exciting light.

According to the second embodiment of the present invention, it is possible to more certainly detect a fault occurring in the optical fiber cable 24 and cause the exciting light source to stop outputting the exciting light.

Figure 5:
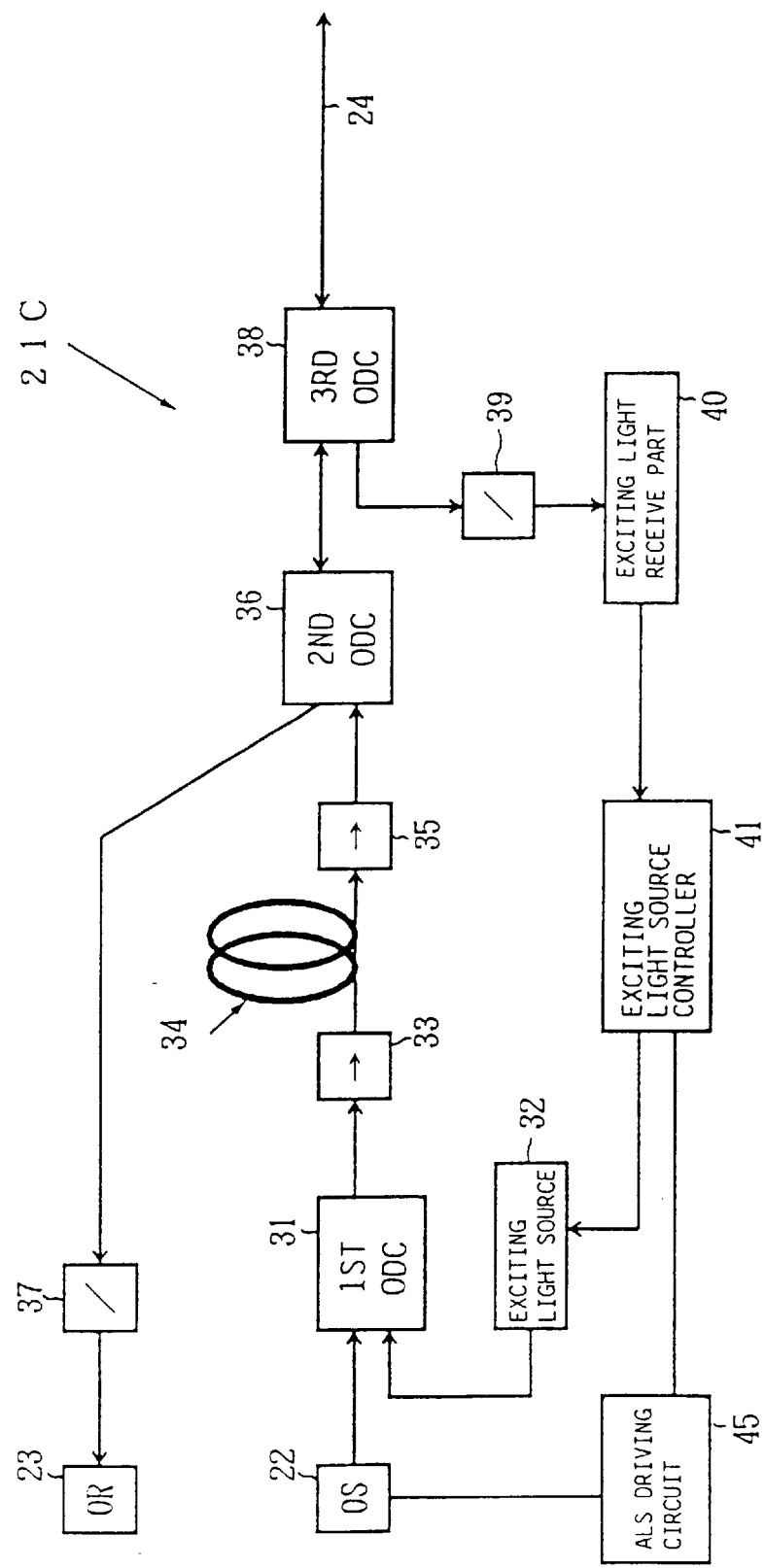
FIG. 5 is a block diagram of a transmission device according to a third embodiment of the present invention.

A description will now be given, with reference to FIG. 5, of a transmission device 21C according to a third embodiment of the present invention. In FIG. 5, parts that are the same as those shown in the previously described figures are given the same reference numbers.

The structure shown in FIG. 5 includes an automatic laser shutdown driving circuit 45, which stops the signal light transmit part 22 outputting the signal light. Hereinafter, the automatic laser shutdown driving circuit 45 is simply referred to as an ALS driving circuit 45. The ALS driving circuit 45 is driven by the exciting light source controller 41, and causes the signal light transmit part 22 to automatically stop outputting the signal light.

In the normal state, the signal light having the wavelength $\lambda_1$ from the transmit part 22 is combined with the exciting light having the wavelength $\lambda_2$ supplied from the exciting light source 32, and is then amplified by the optical amplifier 34. The amplified signal light passes through the optical isolator 35, the second coupler 36 and the third coupler 38, and is applied to the optical fiber cable 24. In this manner, the signal light having the wavelength $\lambda_1$ and the exciting light having the wavelength $\lambda_2$ are sent to a remote transmission device.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the exciting light source 32 to stop outputting the exciting light, and activates the ALS driving circuit 45. Then, the ALS driving circuit 45 stops the signal light transmit part 22 from outputting the signal light.

According to the third embodiment of the present invention, it is possible to stop transmitting the signal light in addition to the exciting light when a fault occurs in the optical fiber cable 24.

Figure 6:
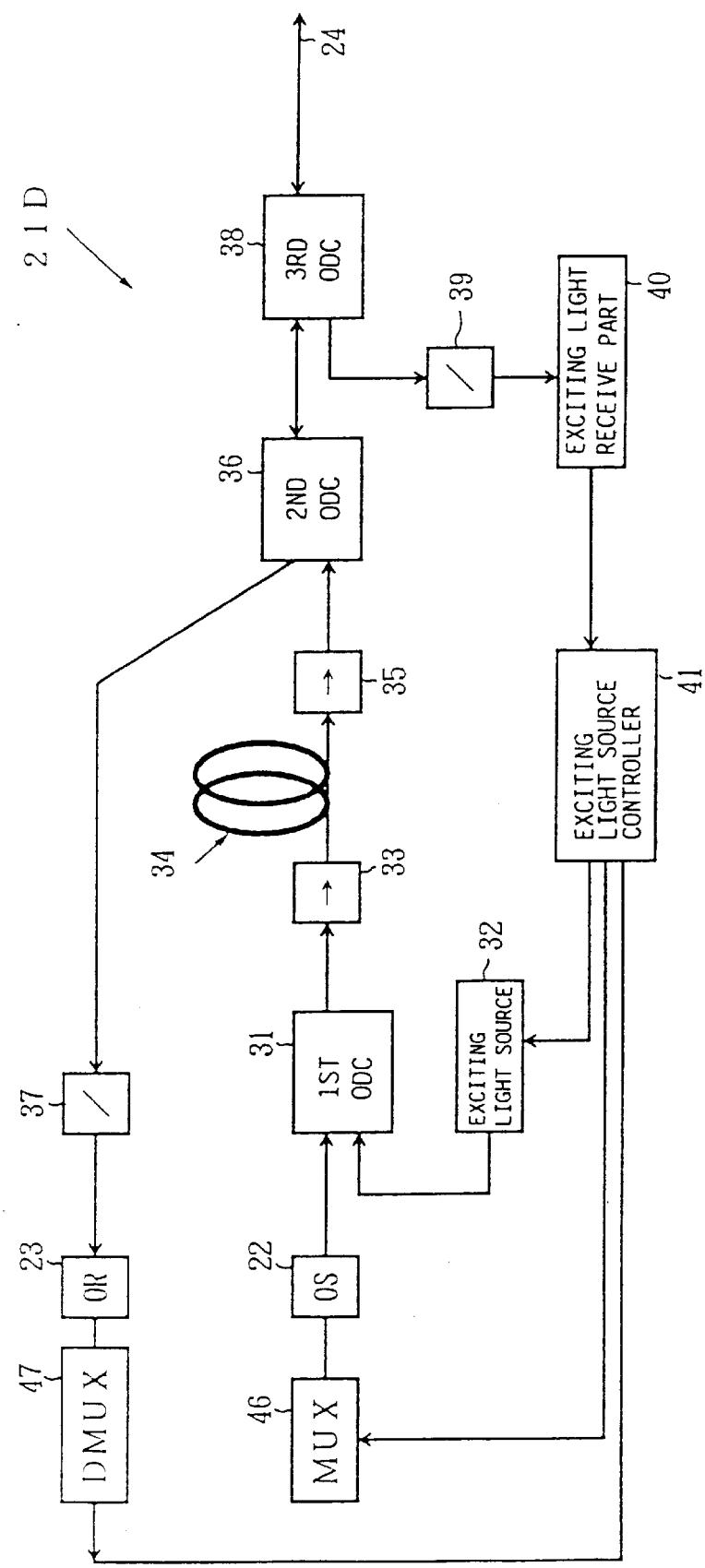
FIG. 6 is a block diagram of a transmission device according to a fourth embodiment of the present invention.

A description will now be given, with reference to FIG. 6, of a transmission device 21D according to a fourth embodiment of the present invention. The fourth embodiment of the present invention employs a signal multiplexer (MUX) 46 and a signal demultiplexer (DMUX) 47. The multiplexer 46 is provided between the exciting light source controller 41 and the signal light transmit part 22. The multiplexer 47 is provided between the exciting light source controller 41 and the signal light receive part 23.

The signal multiplexer 46 inserts a given pattern in a predetermined portion of the signal to be transmitted, such as an overhead field or area of the signal. The signal demultiplexer 47 drops the given pattern inserted in the signal multiplexer 46 from the signal received by the signal light receive part 23, more particularly from the overhead field, and sends the dropped given pattern to the exciting light source controller 41.

In the normal state, the signal light having the wavelength $\lambda_1$ from the transmit part 22 is combined with the exciting light having the wavelength $\lambda_2$ supplied from the exciting light source 32, and is then amplified by the optical amplifier 34. The amplified signal light passes through the optical isolator 35, the second coupler 36 and the third coupler 38, and is applied to the optical fiber cable 24. In this manner, the signal light having the wavelength $\lambda_1$ and the exciting light having the wavelength $\lambda_2$ are sent to a remote transmission device.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the signal multiplexer 46 to insert the given pattern into the overhead field of the signal to be transmitted by the signal light transmit part 22. The transmitted signal including the above given pattern is reflected by the broken part of the optical fiber cable 24 and is returned to the third coupler 38. When the band-pass filter 37 allows the signal having the wavelength $\lambda_1$ to pass therethrough, the received signal is applied to the signal light receive part 23. The signal demultiplexer 47 compares the pattern included in the overhead field with the pattern inserted into the transmitted signal by the signal multiplexer 46. If the patterns coincide with each other, it is determined that the optical fiber cable 24 has a break, and the signal demultiplexer 47 notifies the exciting light controller 41 of the above determination result. Then, the controller 41 controls the exciting light source 32 so that it stops outputting the exciting light.

According to the fourth embodiment of the present invention, it is possible to more certainly detect a fault occurring in the optical fiber cable 24 and cause the exciting light source to stop outputting the exciting light.

Figure 7:
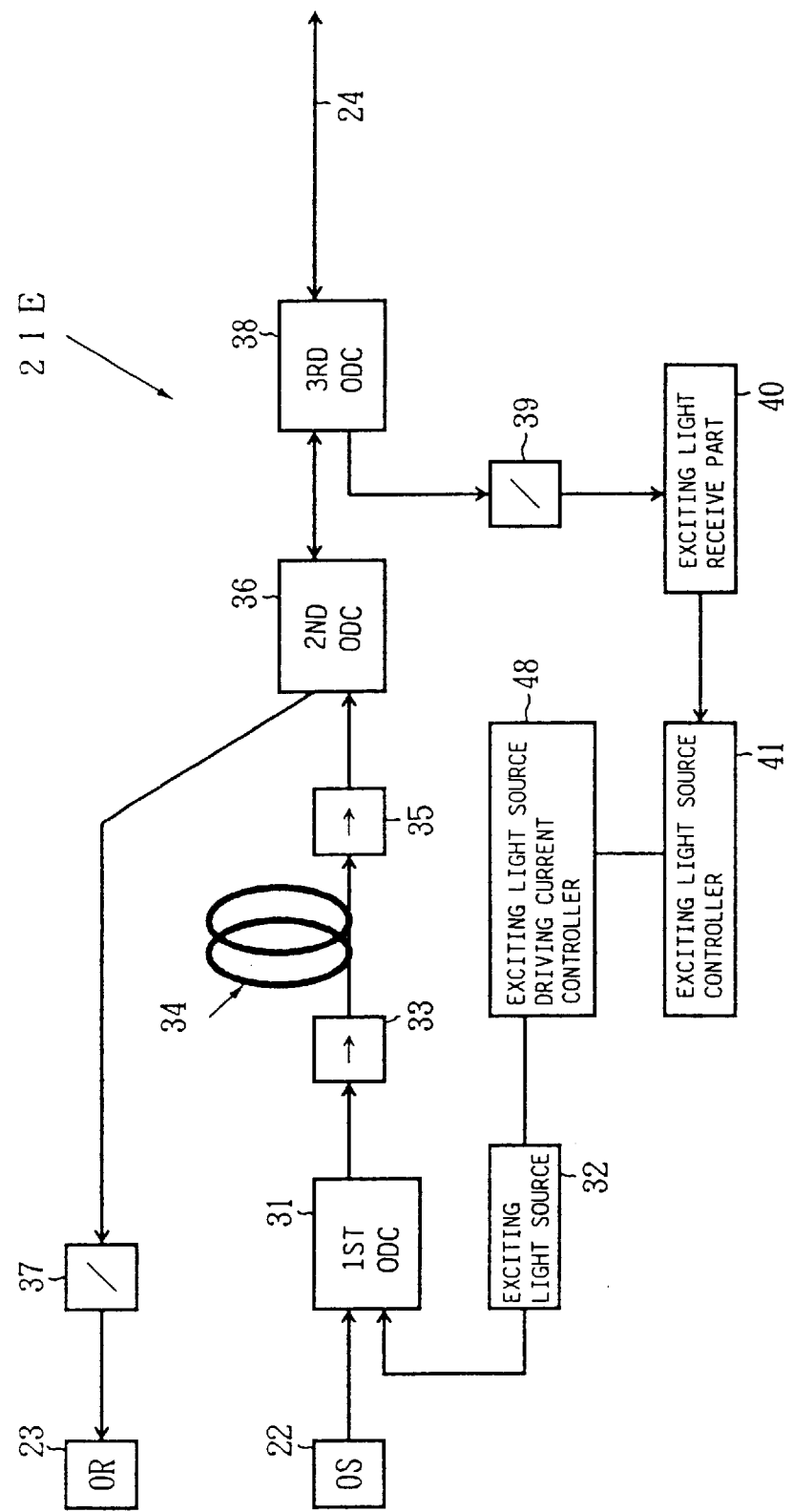
FIG. 7 is a block diagram of a transmission device according to a fifth embodiment of the present invention.

A description will now be given, with reference to FIG. 7, of a transmission device 21E according to a fifth embodiment of the present invention. In FIG. 7, parts that are the same as those shown in the previously described figures are given the same reference numbers.

The fifth embodiment of the present invention includes, in addition to the structure of the first embodiment of the present invention, an exciting light source driving current controller 48, which is provided between the exciting light source controller 41 and the exciting light source 32. The controller 48 changes a driving current flowing in the exciting light source 32 under the control of the exciting light source controller 41, so that the output power of the exciting light emitted from the exciting light source 32 can be changed or becomes zero.

In the normal state, the signal light having the wavelength $\lambda_1$ from the transmit part 22 is combined with the exciting light having the wavelength $\lambda_2$ supplied from the exciting light source 32, and is then amplified by the optical amplifier 34. The amplified signal light passes through the optical isolator 35, the second coupler 36 and the third coupler 38, and is applied to the optical fiber cable 24. In this manner, the signal light having the wavelength $\lambda_1$ and the exciting light having the wavelength $\lambda_2$ are sent to a remote transmission device.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the controller 48 to change the driving current flowing in the exciting light source 32. For example, the controller 41 instructs the controller 48 to decrease the current to a given level. The controller 48 changes (decreases) the driving current flowing in the exciting light source 32, so that the output power of the exciting light is changed and thus the amplifying factor of the optical amplifier 34 is changed.

When the exciting light receive part 40 receives the reflected exciting light, it informs the exciting light source controller 41 of the level of the received exciting light, and determines whether a change in the received exciting light corresponds to the change of the driving current flowing in the exciting light source 32. If the determination result is affirmative, the controller 41 instructs the exciting light source driving current controller 48 to set the driving current equal to zero, so that the exciting light source 32 stops outputting the exciting light.

According to the fifth embodiment of the present invention, it is possible to more certainly detect a fault occurring in the optical fiber cable 24 and cause the exciting light source to stop outputting the exciting light.

Figure 8:
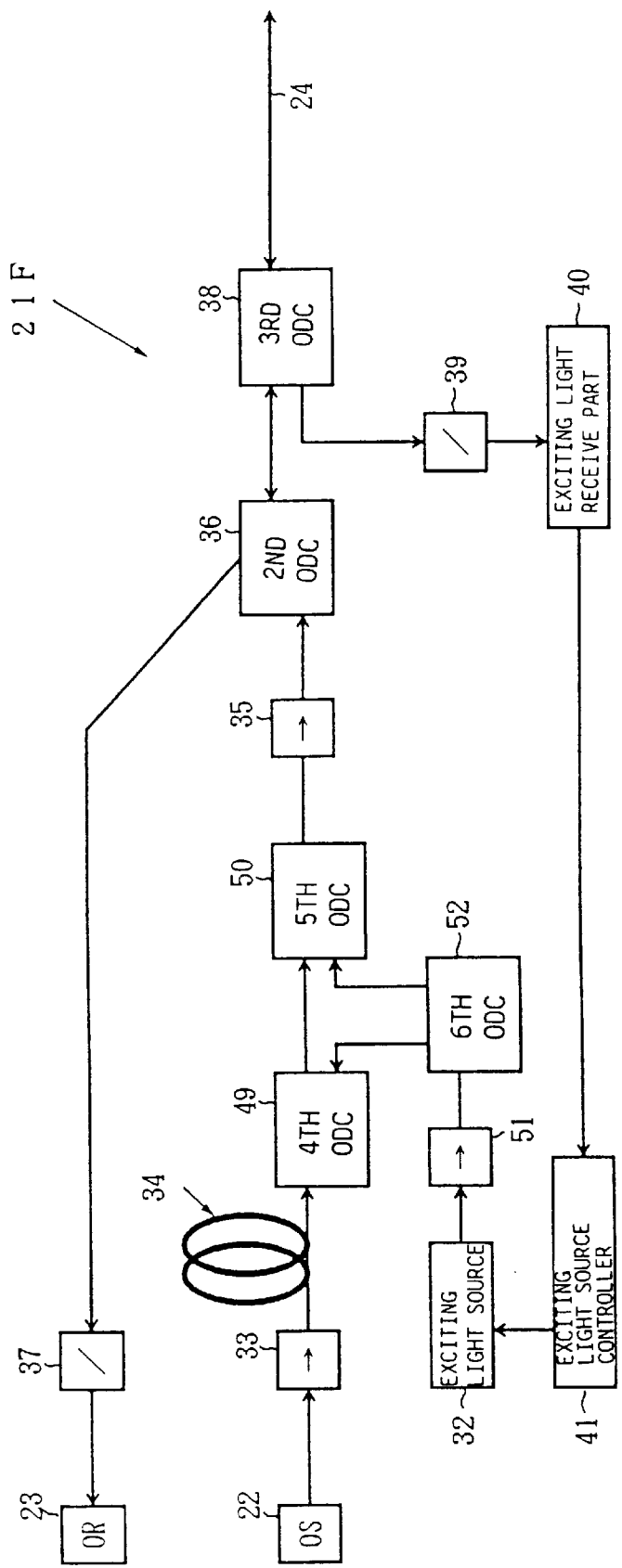
FIG. 8 is a block diagram of a transmission device according to a sixth embodiment of the present invention.

A description will now be given, with reference to FIG. 8, of a transmission device 21F according to a sixth embodiment of the present invention. In FIG. 8, parts that are the same as those shown in the previously described figures are given the same reference numbers. The transmission device 21F is of the backward exciting type, while the transmission device 21A shown in FIG. 2 is of the forward exciting type. The method of controlling the exciting light source 32 is the same as that in the first embodiment of the present invention shown in FIG. 2.

A fourth optical directional coupler 49 and a fifth optical directional coupler 50 are employed instead of the first coupler 31 used in the first embodiment of the present invention. Further, a sixth optical directional coupler 52 is provided and supplies the exciting light having the wavelength $\lambda_2$ to the fourth and fifth couplers 49 and 50. Thus, the optical amplifier 34 is excited backward. Further, in order to detect a fault occurring in the optical fiber cable 24, the exciting light is supplied to the fifth coupler 50 and is finally sent to the optical fiber cable 24. An optical isolator 51 is provided between the exciting light source 32 and the fifth coupler 52.

In the normal state, the signal light from the signal light transmit part 22 is amplified by the optical amplifier 34 by using the exciting light having the wavelength $\lambda_2$ supplied from the exciting light source 32 through the optical isolator 51, the sixth coupler 52 and the fourth coupler 49. The amplified signal light passes through the fifth coupler 50, the optical isolator 35, the second coupler 36 and the third coupler 38, and is applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 stops the exciting light source 32 from outputting the exciting light.

As described above, it is possible to detect a break of the optical fiber cable 24 in the transmission device of the backward exciting type and immediately stop outputting the exciting light when a break of the optical fiber cable 24 occurs.

Figure 9:
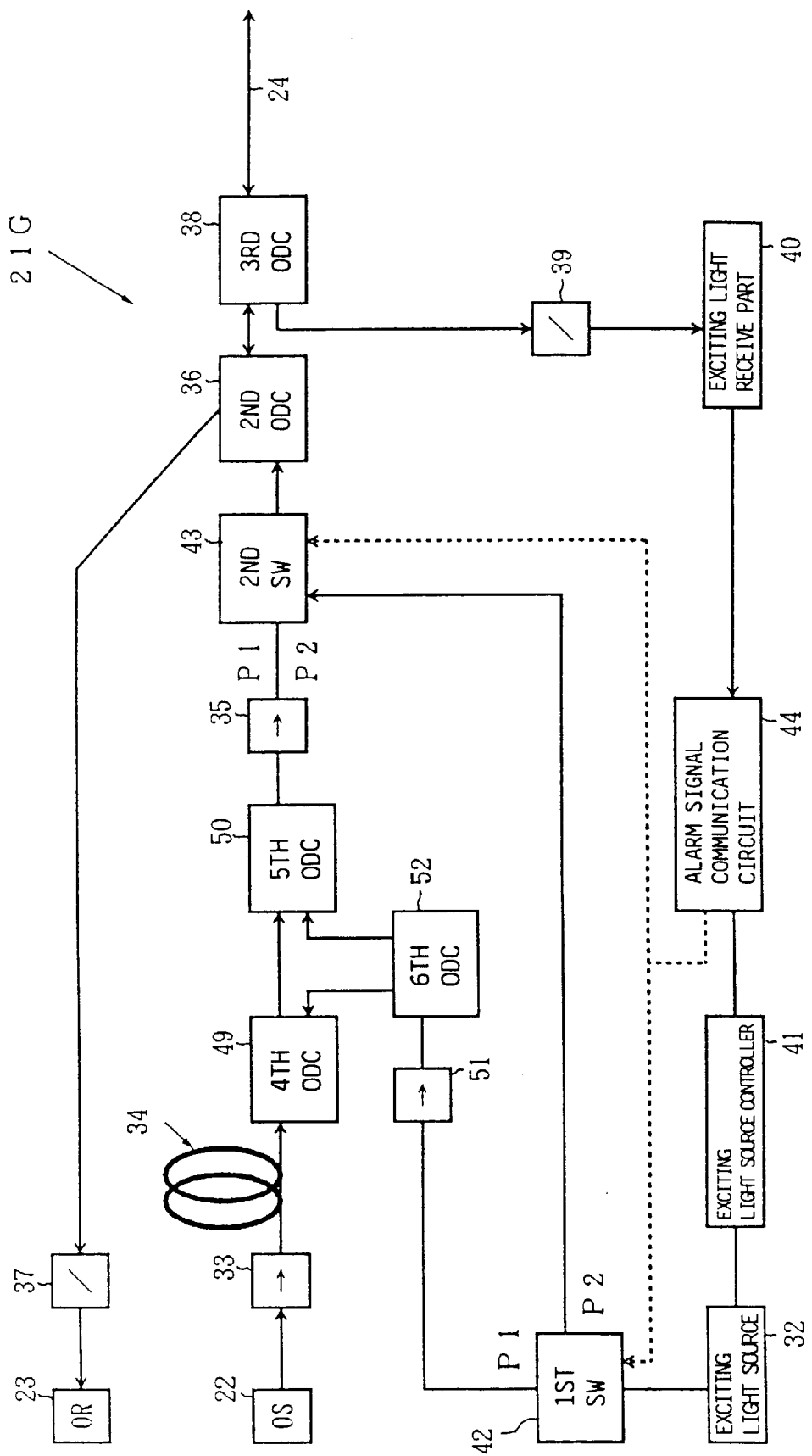
FIG. 9 is a block diagram of a transmission device according to a seventh embodiment of the present invention.

A description will now be given, with reference to FIG. 9, of a transmission device 21G according to a seventh embodiment of the present invention. In FIG. 9, parts that are the same as those shown in the previously described figures are given the same reference numbers. The structure shown in FIG. 9 can be obtained by modifying the structure shown in FIG. 4 so that the optical amplifier 34 is excited backward. In order to realize the above modification, the couplers 49, 50 and 52 and the optical isolator 51 are used in the same manner as those shown in FIG. 8.

More particularly, the first optical switch 42 is provided in between the exciting light source 32 and the third optical isolator 51. The exciting light is supplied to the third optical isolator 51 via the output terminal P1 of the optical switch 42. The second optical switch 43 is provided between the second optical isolator 35 and the second coupler 36. The input terminal P1 of the second optical switch 43 is supplied with the signal light from the optical isolator 35, and the other input terminal P2 thereof is supplied with the exciting light via the output terminal P2 of the first optical switch 42.

As has been described previously, the alarm signal communication circuit 44 is provided between the exciting light receive part 40 and the exciting light source controller 41. The alarm signal communication circuit 44 generates the alarm signal having the given pattern and detects the alarm signal reflected by an end surface of a broken part of the optical fiber cable 24. Further, the alarm signal communication circuit 44 controls the first optical switch 42 and the second optical switch 43 so that these switches select the terminals P2 when generating the alarm signal. In the normal state, the first and second switches 42 and 43 select the terminals P1.

In the normal state, the signal light having the wavelength $\lambda_1$ from the transmit part 22 is amplified by using the exciting light having the wavelength $\lambda_2$ supplied from the exciting light source 32 through the output terminal P1 of the first optical switch 42, the optical isolator 51 and couplers 52 and 49. The amplified signal light passes through the couplers 49 and 50, the second optical switch 43, the second coupler 36 and the third coupler 38, and is applied to the optical fiber cable 24. The exciting light having the wavelength $\lambda_2$ passes through the couplers 52 and 50, the optical isolator 35 and the couplers 36 and 38, and is then applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$, If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the alarm signal communication circuit 44. In response to the fault detection signal, the alarm signal communication circuit 44 causes the first and second switches 42 and 43 to select the terminals P2, and outputs the alarm signal having the given pattern to the exciting light source controller 41. Then, the controller 41 modulates the exciting light source 32 by the given pattern of the alarm signal. The modulated exciting light passes through the output terminal P2 of the first optical switch 42 and is applied to the input terminal P2 of the second optical switch 43.

Then, the modulated exciting light passes through the second coupler 36 and the third coupler 38, and is applied to the optical fiber cable 24. The modulated exciting light is then reflected by the broken part of the cable 24 and is returned to the third coupler 38. The modulated exciting light passes through the second band-pass filter 39, and is applied to the exciting light receive part 40. Then, the exciting light receive part 40 outputs a corresponding electric signal to the alarm signal communication circuit 44. The circuit 44 compares the pattern used to modulate the exciting light with the pattern contained in the received signal from the receive part 40, and makes a decision as to whether the patterns coincide with each other. If it is determined that the patterns coincide with each other, the alarm signal communication circuit 44 controls the exciting light source controller 41 so that the exciting light source 32 stops outputting the exciting light.

According to the seventh embodiment of the present invention, it is possible to detect a break of the optical fiber cable 24 in the transmission device of the backward exciting type and immediately stop outputting the exciting light when a break of the optical fiber cable 24 occurs.

Figure 10:
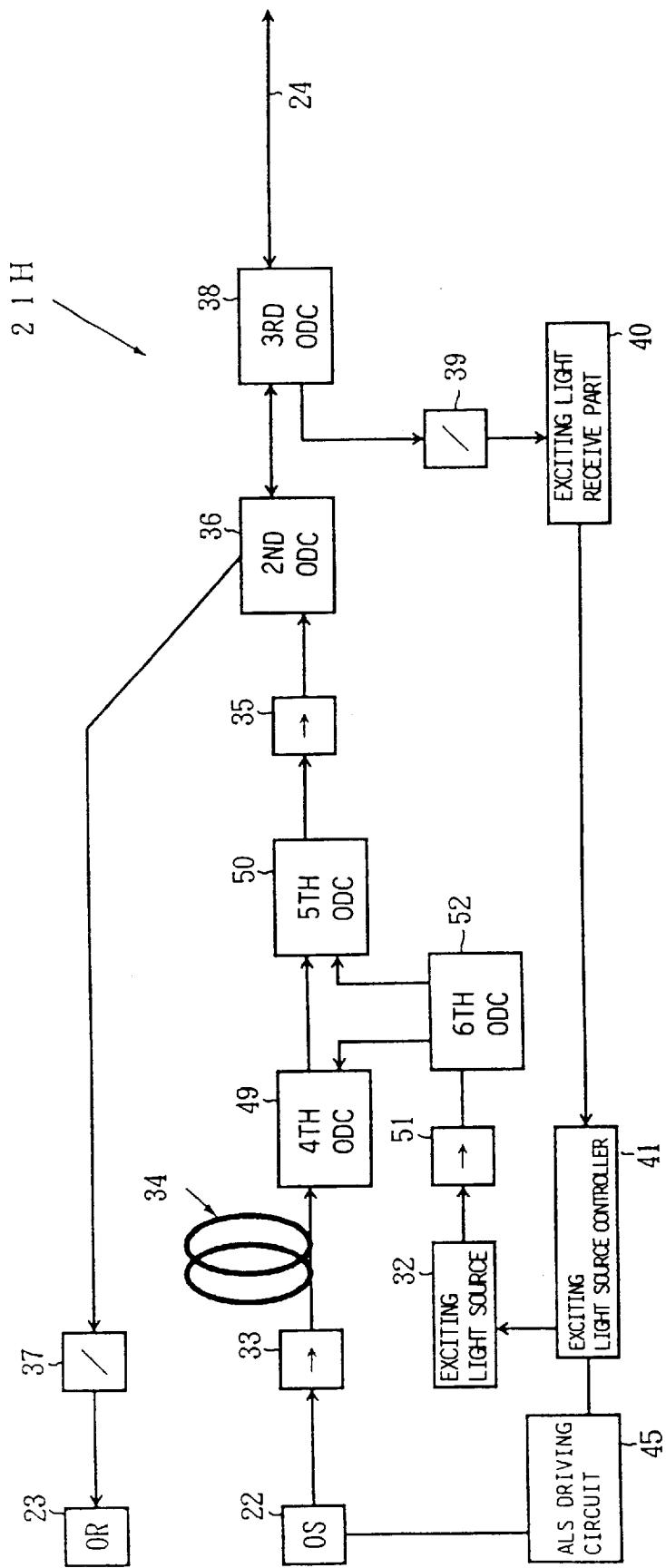
FIG. 10 is a block diagram of a transmission device according to an eighth embodiment of the present invention.

A description will now be given, with reference to FIG. 10, of a transmission device 21H according to an eighth embodiment of the present invention. In FIG. 10, parts that are the same as those shown in the previously described figures are given the same reference numbers. The structure shown in FIG. 10 can be obtained by modifying the structure shown in FIG. 5 so that the optical amplifier 34 is excited backward. In order to realize the above modification, the couplers 49, 50 and 52 and the optical isolator 51 are used in the same manner as those shown in FIG. 8.

As has been described previously, the ALS driving circuit 45 is driven by the exciting light source controller 41, and causes the signal light transmit part 22 to automatically stop outputting the signal light.

In the normal state, the signal light having the wavelength $\lambda_1$ from the transmit part 22 is amplified by using the exciting light having the wavelength $\lambda_2$ supplied from the exciting light source 32. The amplified signal light passes through the couplers 49 and 50, the optical isolator 35, the second coupler 36 and the third coupler 38, and is then applied to the optical fiber cable 24. The exciting light having the wavelength $\lambda_2$ passes through the couplers 52 and 50, the optical isolator 35, the couplers 36 and 38, and is then applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the exciting light source 32 to stop outputting the exciting light, and activates the ALS driving circuit 45. Then, the ALS driving circuit 45 stops the signal light transmit part 22 from outputting the signal light.

According to the eighth embodiment of the present invention, it is possible to stop transmitting the signal light in addition to the exciting light in the backward exciting type when a fault occurs in the optical fiber cable 24.

Figure 11:
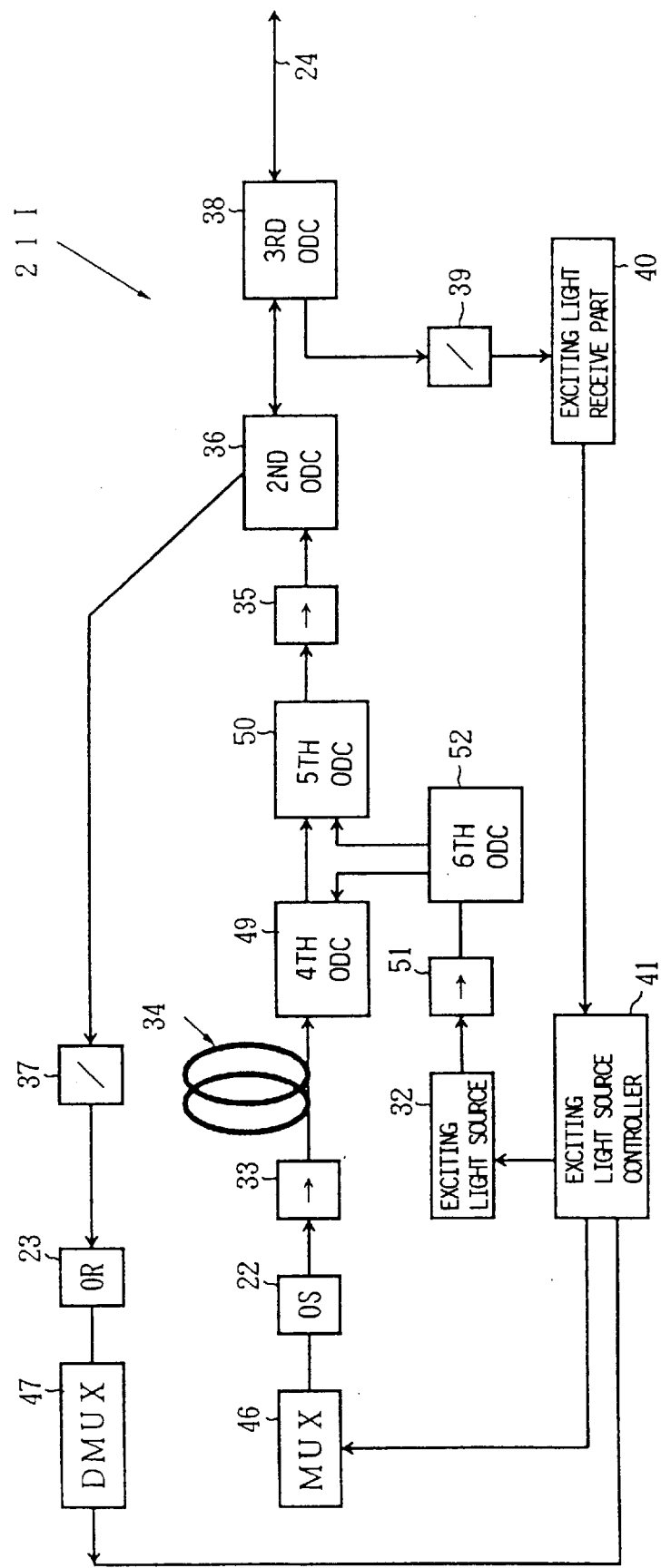
FIG. 11 is a block diagram of a transmission device according to a ninth embodiment of the present invention.

A description will now be given, with reference to FIG. 11, of a transmission device 21I according to a ninth embodiment of the present invention. In FIG. 11, parts that are the same as those shown in the previously described figures are given the same reference numbers. The structure shown in FIG. 11 can be obtained by modifying the structure shown in FIG. 6 so that the optical amplifier 34 is excited backward. In order to realize the above modification, the couplers 49, 50 and 52 and the optical isolator 51 are used in the same manner as those shown in FIG. 8.

In the normal state, the signal light having the wavelength $\lambda_1$ from the transmit part 22 is amplified by using the exciting light having the wavelength $\lambda_2$ supplied from the exciting light source 32 through the optical isolator 51, the coupler 52 and the coupler 49. The amplified signal light passes through the couplers 49 and 50, the optical isolator 35, the second coupler 36 and the third coupler 38, and is then applied to the optical fiber cable 24. The exciting light having the wavelength $\lambda_2$ passes through the couplers 52 and 50, the optical isolator 35 and the couplers 36 and 38, and is then applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the signal multiplexer 46 to insert the given pattern into the overhead field of the signal to be transmitted by the signal light transmit part 22. The transmitted signal including the above given pattern is reflected by the broken part of the optical fiber cable 24 and is returned to the third coupler 38. When the band-pass filter 37 allows the signal having the wavelength $\lambda_1$ to pass therethrough, the received signal is applied to the signal light receive part 23. The signal demultiplexer 47 compares the pattern included in the overhead field with the pattern inserted into the transmitted signal by the signal multiplexer 46. If the patterns coincide with each other, it is determined that the optical fiber cable 24 has a break, and the signal demultiplexer 47 notifies the exciting light controller 41 of the above determination result. Then, the controller 41 controls the exciting light source 32 so that it stops outputting the exciting light.

According to the tenth embodiment of the present invention, it is possible to more certainly detect a fault occurring in the optical fiber cable 24 and cause the exciting light source to stop outputting the exciting light in the backward exciting type.

Figure 12:
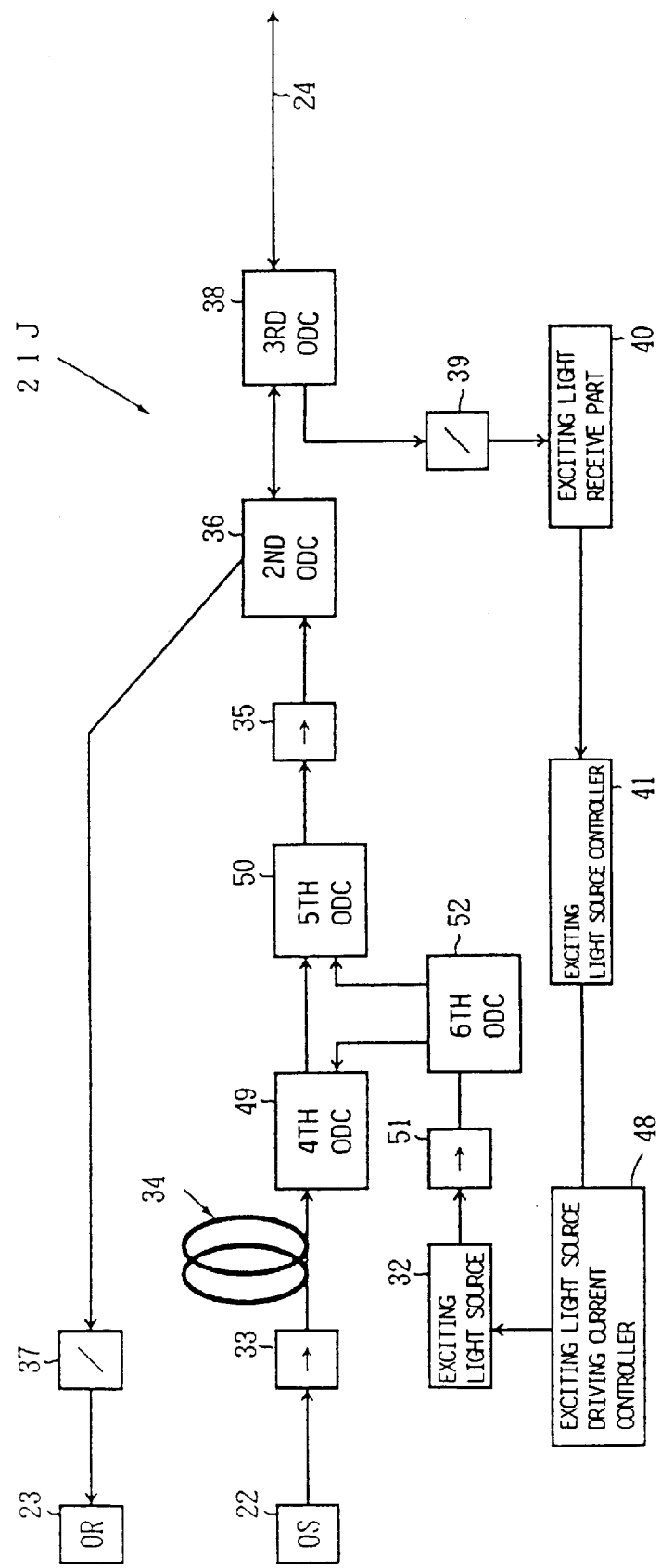
FIG. 12 is a block diagram of a transmission device according to a tenth embodiment of the present invention.

A description will now be given, with reference to FIG. 12, of a transmission device 21J according to a tenth embodiment of the present invention. In FIG. 12, parts that are the same as those shown in the previously described figures are given the same reference numbers. The structure shown in FIG. 12 can be obtained by modifying the structure shown in FIG. 7 so that the optical amplifier 34 is excited backward. In order to realize the above modification, the couplers 49, 50 and 52 and the optical isolator 51 are used in the same manner as those shown in FIG. 8.

In the normal state, the signal light having the wavelength $\lambda_1$ from the transmit part 22 is amplified by using the exciting light having the wavelength $\lambda_2$ supplied from the exciting light source 32. The amplified signal light passes through the couplers 49 and 50, the optical isolator 35, the second coupler 36 and the third coupler 38, and is applied to the optical fiber cable 24. The exciting light having the wavelength $\lambda_2$ passes through the couplers 52 and 50, the optical isolator 35, and the couplers 36 and 38, and is then applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the controller 48 to change the driving current flowing in the exciting light source 32. For example, the controller 41 instructs the controller 48 to decrease the current to a given level. The controller 48 changes (decreases) the driving current flowing in the exciting light source 32, so that the output power of the exciting light is changed and thus the amplifying factor of the optical amplifier 34 is changed.

When the exciting light receive part 40 receives the reflected exciting light, it informs the exciting light source controller 41 of the level of the received exciting light, and determines whether a change in the received exciting light corresponds to the change of the driving current flowing in the exciting light source 32. If the determination result is affirmative, the controller 41 instructs the exciting light source driving current controller 48 to set the driving current equal to zero, so that the exciting light source 32 stops outputting the exciting light.

According to the tenth embodiment of the present invention, it is possible to more certainly detect a fault occurring in the optical fiber cable 24 and cause the exciting light source to stop outputting the exciting light in the backward exciting type.

Figure 13:
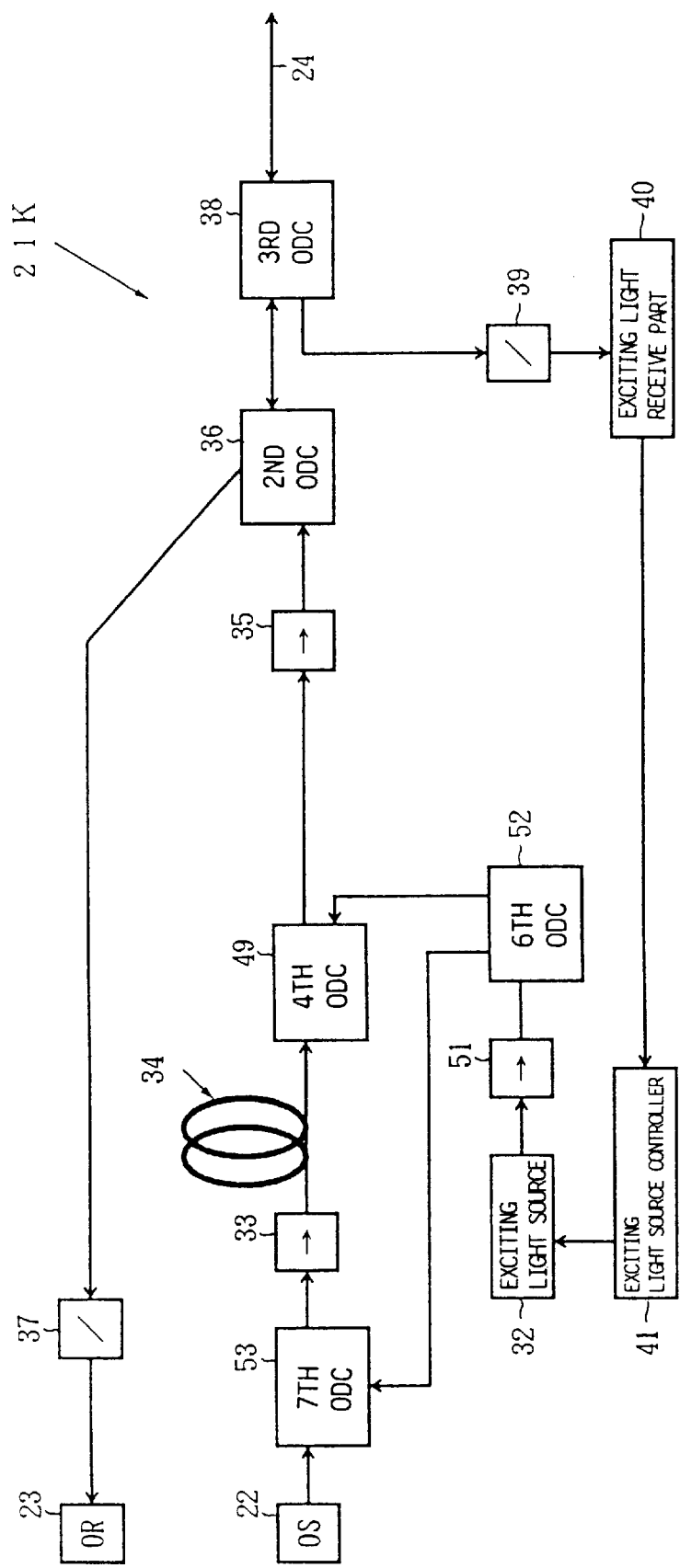
FIG. 13 is a block diagram of a transmission device according to an eleventh embodiment of the present invention.

A description will now be given, with reference to FIG. 13, of a transmission device 21K according to an eleventh embodiment of the present invention. In FIG. 13, parts that are the same as those shown in the previously described figures are given the same reference numbers. The structure shown in FIG. 13 can be obtained by modifying the structure shown in FIG. 8 so that a seventh optical directional coupler 53 is used instead of the coupler 50 shown in FIG. 8. The coupler 53 is provided between the signal light transmit part 22 and the optical isolator 33. The light amplifier 34 can be excited forward and backward via the couplers 53 and 49, respectively.

In the normal state, the signal light from the signal light transmit part 22 is amplified by the optical amplifier 34 by using the exciting light having the wavelength $\lambda_2$ forward and backward supplied from the exciting light source 32 through the optical isolator 51 and the couplers 52, 49 and 53. The amplified signal light passes through the optical isolator 35, the second coupler 36 and the third coupler 38, and is applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 stops the exciting light source 32 from outputting the exciting light.

As described above, it is possible to detect a break of the optical fiber cable 24 in the transmission device of the bidirection (forward and backward) exciting type and immediately stop outputting the exciting light when a break of the optical fiber cable 24 occurs.

Figure 14:
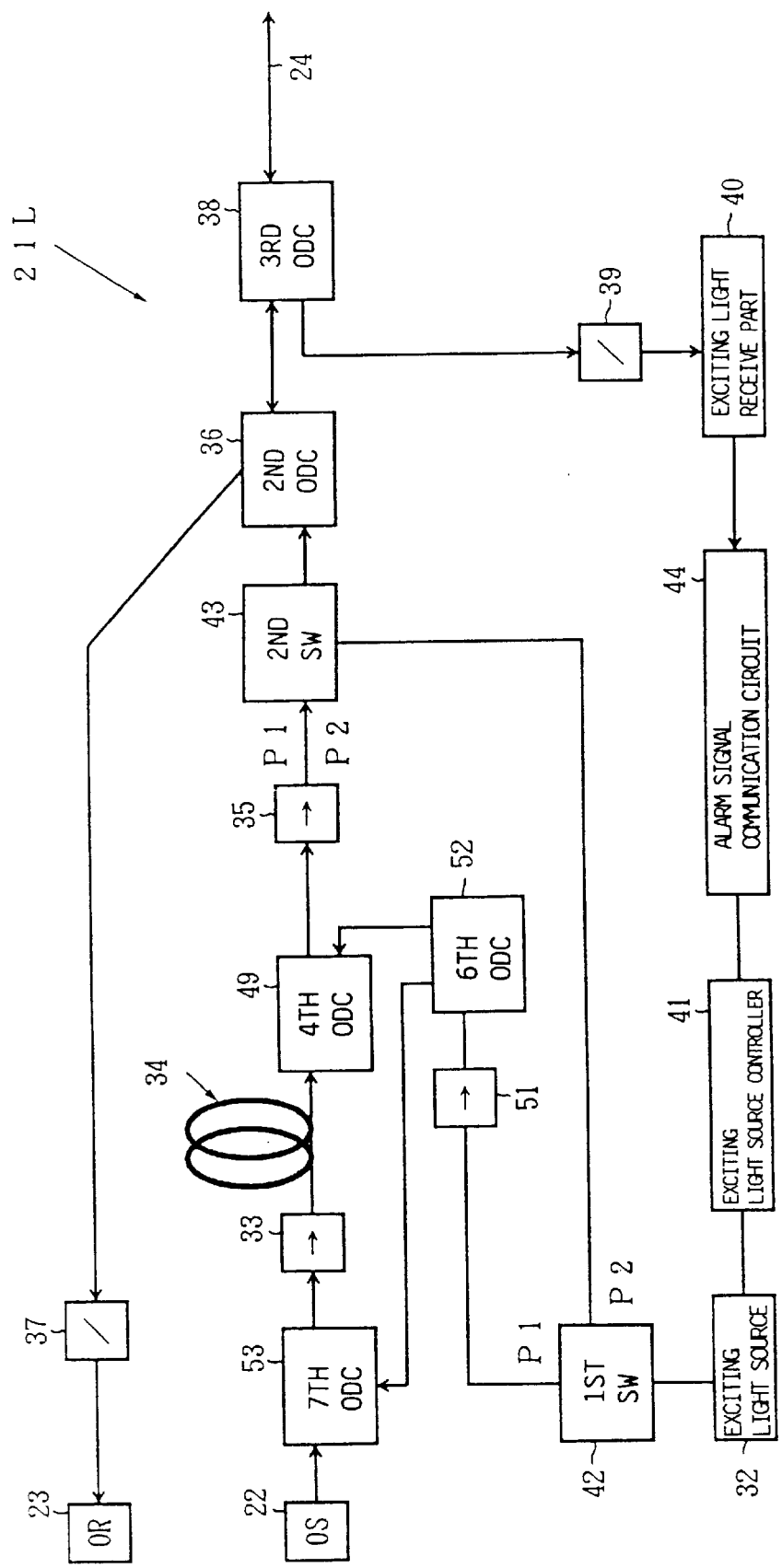
FIG. 14 is a block diagram of a transmission device according to a twelfth embodiment of the present invention.

A description will now be given, with reference to FIG. 14, of a transmission device 21L according to a twelfth embodiment of the present invention. In FIG. 14, parts that are the same as those shown in the previously described figures are given the same reference numbers. The structure shown in FIG. 14 can be obtained by modifying the structure shown in FIG. 9 so that the coupler 53 is used instead of the coupler 50 shown in FIG. 9. The coupler 53 is provided between the signal light transmit part 22 and the optical isolator 33. The light amplifier 34 can be excited forward and backward via the couplers 53 and 49, respectively.

In the normal state, the signal light having the wavelength $\lambda_1$ from the transmit part 22 is amplified by using the exciting light having the wavelength $\lambda_2$ forward and backward supplied from the exciting light source 32. The amplified signal light passes through the coupler 49, the optical isolator 35, the second optical switch 43, the second coupler 36 and the third coupler 38, and is applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the alarm signal communication circuit 44. In response to the fault detection signal, the alarm signal communication circuit 44 causes the first and second switches 42 and 43 to select the terminals P2, and outputs the alarm signal having the given pattern to the exciting light source controller 41. Then, the controller 41 modulates the exciting light source 32 by the given pattern of the alarm signal. The modulated exciting light passes through the output terminal P2 of the first optical switch 42 and is applied to the input terminal P2 of the second optical switch 43.

Then, the modulated exciting light passes through the second coupler 36 and the third coupler 38, and is applied to the optical fiber cable 24. The modulated exciting light is then reflected by the broken part of the cable 24 and is returned to the third coupler 38. The modulated exciting light passes through the second band-pass filter 39, and is applied to the exciting light receive part 40. Then, the exciting light receive part 40 outputs a corresponding electric signal to the alarm signal communication circuit 44. The circuit 44 compares the pattern used to modulate the exciting light with the pattern contained in the received signal from the receive part 40, and makes a decision as to whether the patterns coincide with each other. If it is determined that the patterns coincide with each other, the alarm signal communication circuit 44 controls the exciting light source controller 41 so that the exciting light source 32 stops outputting the exciting light.

According to the twelfth embodiment of the present invention, it is possible to detect a break of the optical fiber cable 24 in the transmission device of the bidirection exciting type and immediately stop outputting the exciting light when a break of the optical fiber cable 24 occurs.

Figure 15:
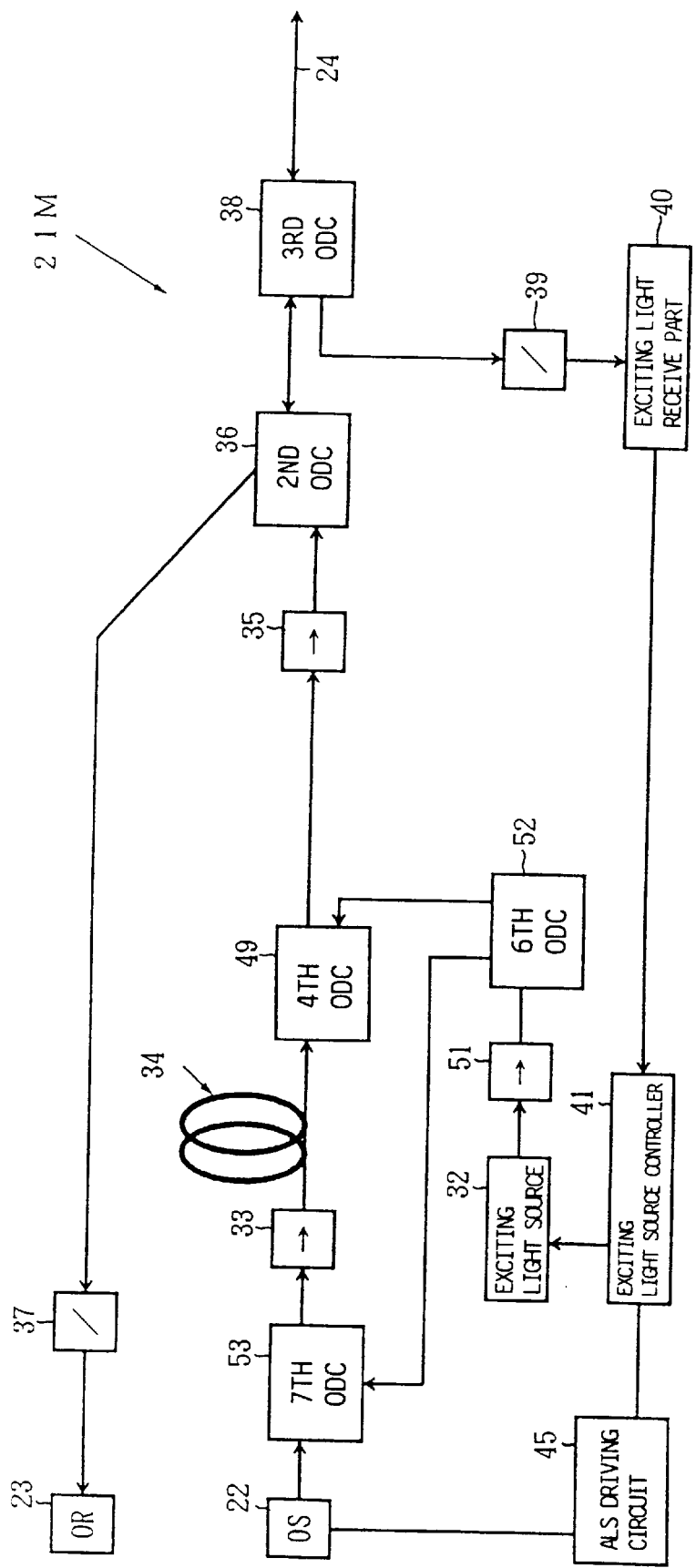
FIG. 15 is a block diagram of a transmission device according to a thirteenth embodiment of the present invention.

A description will now be given, with reference to FIG. 15, of a transmission device 21M according to a thirteenth embodiment of the present invention. In FIG. 15, parts that are the same as those shown in the previously described figures are given the same reference numbers. The structure shown in FIG. 15 can be obtained by modifying the structure shown in FIG. 10 so that the coupler 53 is used instead of the coupler 50 shown in FIG. 10. The coupler 53 is provided between the signal light transmit part 22 and the optical isolator 33. The light amplifier 34 can be excited forward and backward via the couplers 53 and 49, respectively.

As has been described previously, the ALS driving circuit 45 is driven by the exciting light source controller 41, and causes the signal light transmit part 22 to automatically stop outputting the signal light.

In the normal state, the signal light having the wavelength $\lambda_1$ from the transmit part 22 is amplified by using the exciting light having the wavelength $\lambda_2$ forward and backward supplied from the exciting light source 32. The amplified signal light passes through the coupler 49, the optical isolator 35, the second coupler 36 and the third coupler 38, and is then applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the exciting light source 32 to stop outputting the exciting light, and activates the ALS driving circuit 45. Then, the ALS driving circuit 45 stops the signal light transmit part 22 from outputting the signal light.

According to the thirteenth embodiment of the present invention, it is possible to stop transmitting the signal light in addition to the exciting light in the bidirection exciting type when a fault occurs in the optical fiber cable 24.

Figure 16:
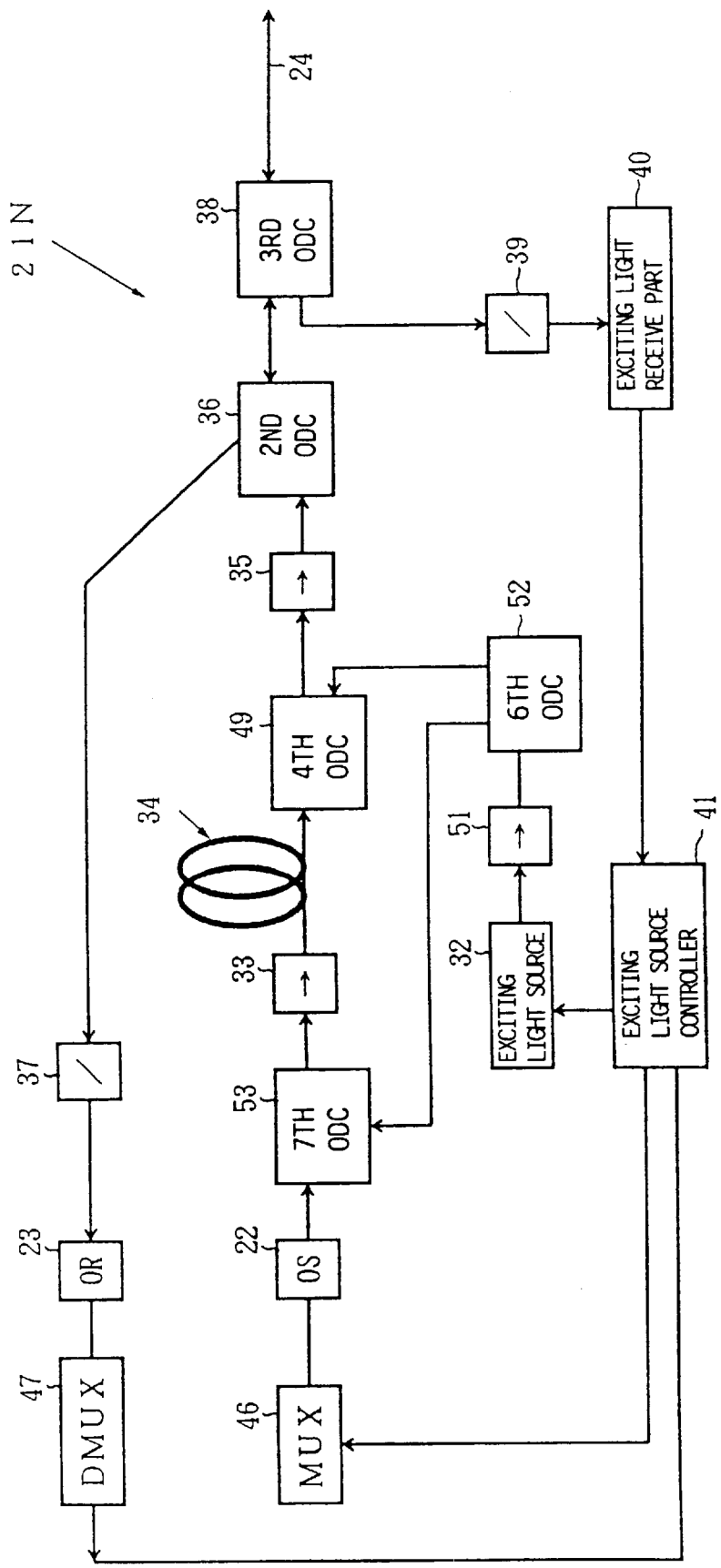
FIG. 16 is a block diagram of a transmission device according to a fourteenth embodiment of the present invention.

A description will now be given, with reference to FIG. 16, of a transmission device 21N according to a fourteenth embodiment of the present invention. In FIG. 16, parts that are the same as those shown in the previously described figures are given the same reference numbers. The structure shown in FIG. 16 can be obtained by modifying the structure shown in FIG. 11 so that the coupler 53 is used instead of the coupler 50 shown in FIG. 11. The coupler 53 is provided between the signal light transmit part 22 and the optical isolator 33. The light amplifier 34 can be excited forward and backward via the couplers 53 and 49, respectively.

In the normal state, the signal light having the wavelength $\lambda_1$ from the transmit part 22 is amplified by using the exciting light having the wavelength $\lambda_2$ supplied forward and backward from the exciting light source 32. The amplified signal light passes through the coupler 49, the optical isolator 35, the second coupler 36 and the third coupler 38, and is then applied to the optical fiber cable 24. The exciting light having the wavelength $\lambda_2$ passes through the couplers 52 and 49, the optical isolator 35 and the couplers 36 and 38, and is then applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the signal multiplexer 46 to insert the given pattern signal into the overhead field of the signal to be transmitted by the signal light transmit part 22. The transmitted signal including the above given pattern is reflected by the broken part of the optical fiber cable 24 and is returned to the third coupler 38. When the band-pass filter 37 allows the signal having the wavelength $\lambda_1$ to pass therethrough, the received signal is applied to the signal light receive part 23. The signal demultiplexer 47 compares the pattern included in the overhead field with the pattern inserted into the transmitted signal by the signal multiplexer 46. If the patterns coincide with each other, it is determined that the optical fiber cable 24 has a break, and the signal demultiplexer 47 notifies the exciting light controller 41 of the above determination result. Then, the controller 41 controls the exciting light source 32 so that it stops outputting the exciting light.

According to the fourteenth embodiment of the present invention, it is possible to more certainly detect a fault occurring in the optical fiber cable 24 and cause the exciting light source to stop outputting the exciting light in the bidirection exciting type.

Figure 17:
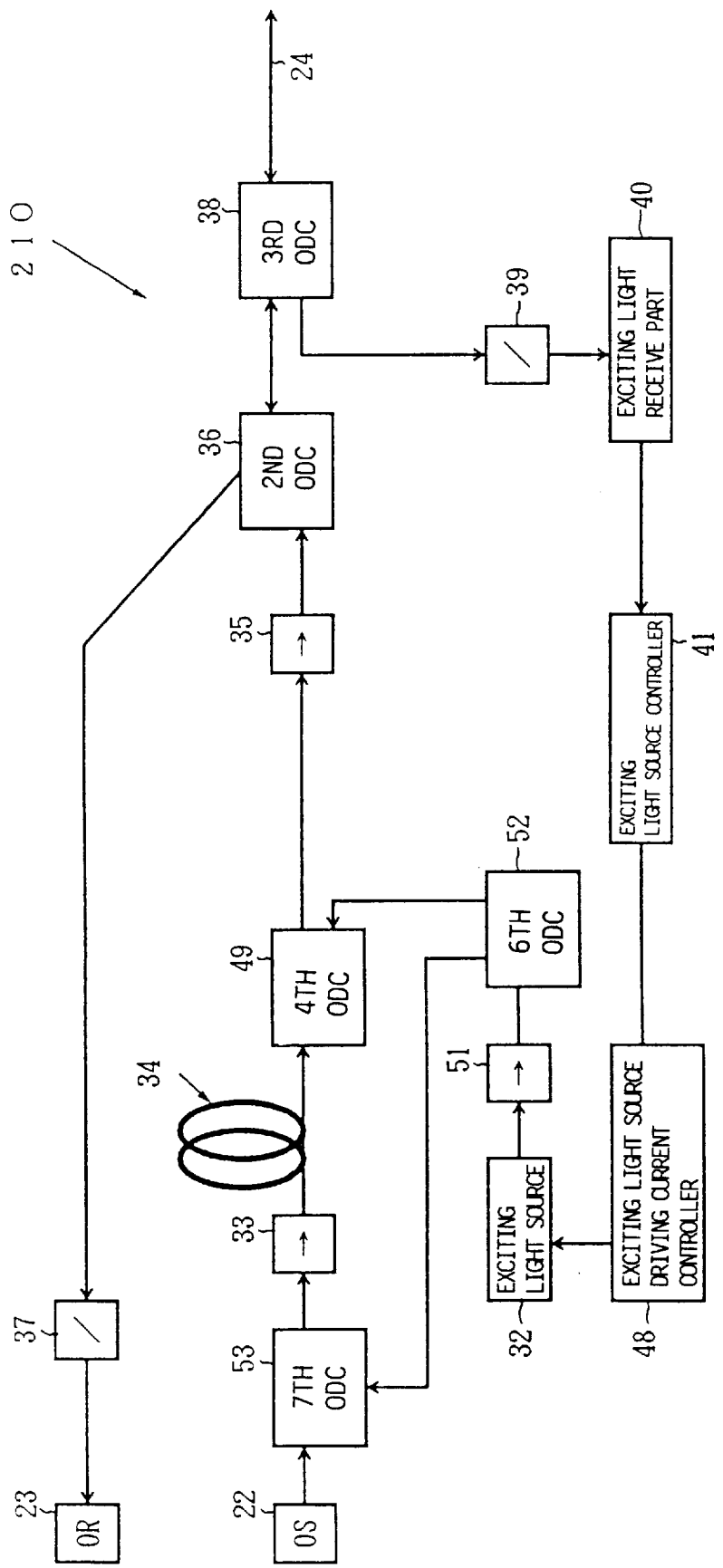
FIG. 17 is a block diagram of a transmission device according to a fifteenth embodiment of the present invention.

A description will now be given, with reference to FIG. 17, of a transmission device 21O according to a fifteenth embodiment of the present invention. In FIG. 17, parts that are the same as those shown in the previously described figures are given the same reference numbers. The structure shown in FIG. 17 can be obtained by modifying the structure shown in FIG. 12 so that the coupler 53 is used instead of the coupler 50 shown in FIG. 12. The coupler 53 is provided between the signal light transmit part 22 and the optical isolator 33. The light amplifier 34 can be excited forward and backward via the couplers 53 and 49, respectively.

In the normal state, the signal light having the wavelength $\lambda_1$ from the transmit part 22 is amplified by using the exciting light having the wavelength $\lambda_2$ supplied forward and backward from the exciting light source 32. The amplified signal light passes through the coupler 49, the optical isolator 35, the second coupler 36 and the third coupler 38, and is applied to the optical fiber cable 24.

The light transmitted by the remote transmission device is applied to the second coupler 36 and the second band-pass filter 39 by means of the third coupler 38. The second coupler 36 supplies the received light to the first band-pass filter 37, which applies only the signal light from the remote transmission device to the receive part 23.

The light transmitted by the remote transmission device cannot pass through the second band-pass filter 39 because it does not contain light having the wavelength $\lambda_2$.

If a break occurs in the optical fiber cable 24, the signal light and the exciting light are reflected by the broken part and enter the third coupler 38, which supplies the received signals to the second coupler 36 and the second band-pass filter 39. The reflected exciting light passes through the second band-pass filter 39 and is detected by the exciting light receive part 40. Then, the receive part 40 outputs the fault detection signal to the exciting light source controller 41. Then, the controller 41 causes the controller 48 to change the driving current flowing in the exciting light source 32. For example, the controller 41 instructs the controller 48 to decrease the current to a given level. The controller 48 changes (decreases) the driving current flowing in the exciting light source 32, so that the output power of the exciting light is changed and thus the amplifying factor of the optical amplifier 34 is changed.

When the exciting light receive part 40 receives the reflected exciting light, it informs the exciting light source controller 41 of the level of the received exciting light, and determines whether a change in the received exciting light corresponds to the change of the driving current flowing in the exciting light source 32. If the determination result is affirmative, the controller 41 instructs the exciting light source driving current controller 48 to set the driving current equal to zero, so that the exciting light source 32 stops outputting the exciting light.

According to the fifteenth embodiment of the present invention, it is possible to more certainly detect a fault occurring in the optical fiber cable 24 and cause the exciting light source to stop outputting the exciting light in the bidirection exciting type.

A description will now be given of variations of the aforementioned first through fifteenth embodiments of the present invention. In the variations, a wavelength division multiplexer (WDM) element is employed instead of the first optical directional coupler 38 used in the first through fifteenth embodiments of the present invention. Use of the WDM element contributes to reduce the size of the transmission device.

Figure 3:
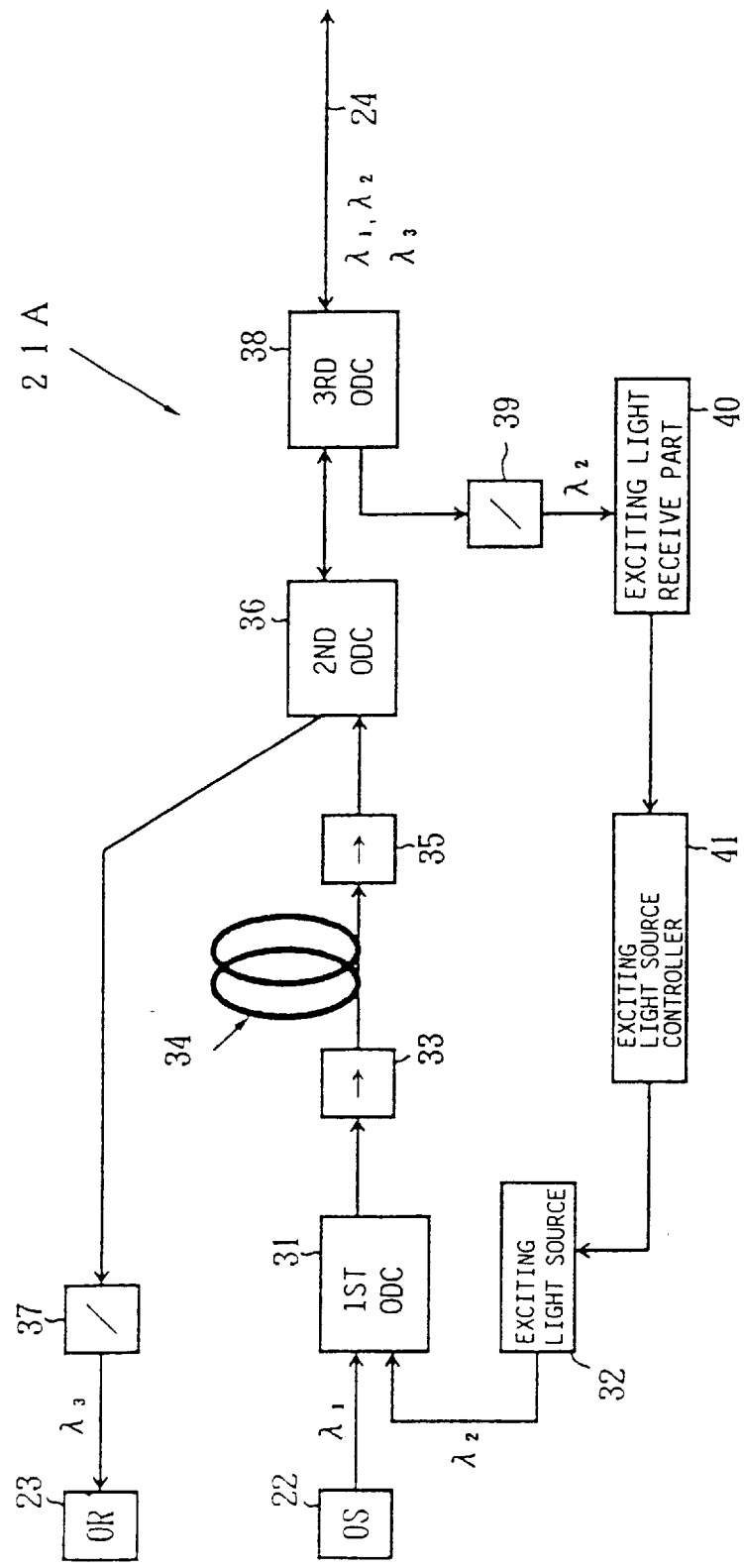
FIG. 3 is another block diagram of the transmission device according to the first embodiment of the present invention.
Figure 4:
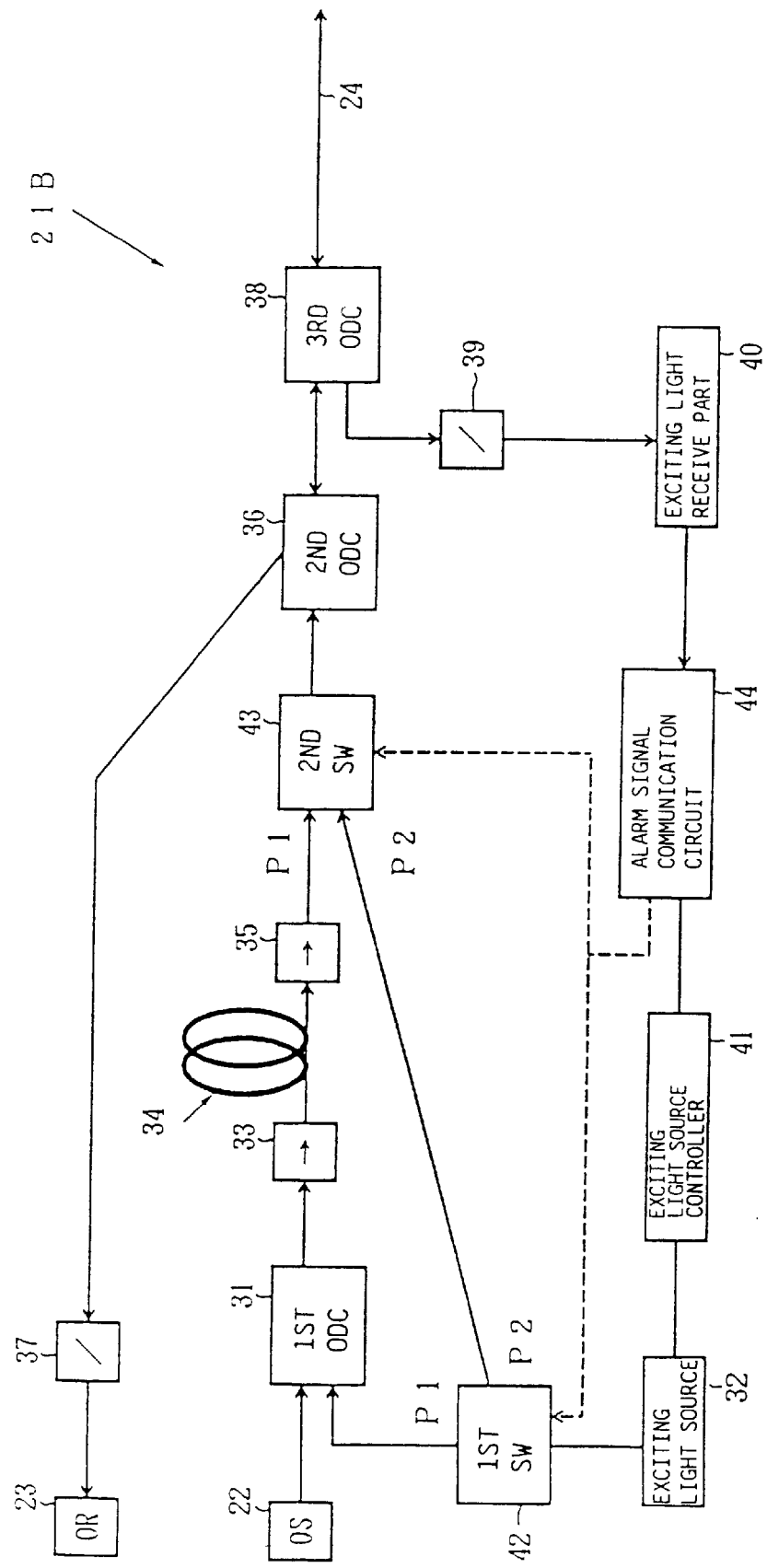
FIG. 4 is a block diagram of a transmission device according to a second embodiment of the present invention.
Figure 18:
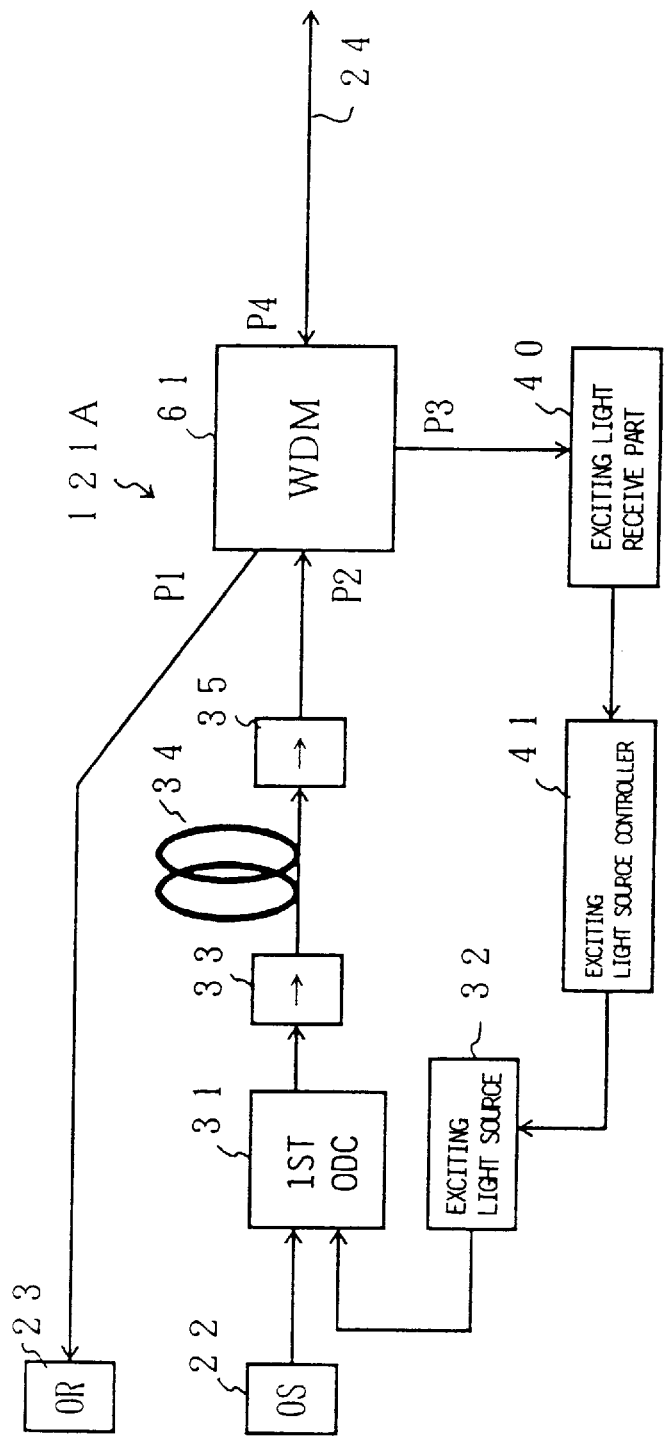
FIG. 18 is a block diagram of a variation of the transmission device according to the first embodiment of the present invention.

FIG. 18 is a diagram of a transmission device 121A according to a modification of the first embodiment of the present invention shown in FIGS. 2 and 3. In FIG. 18, parts that are the same as those shown in the previously described figures are given the same reference numbers. The third optical directional coupler 38 used in the first embodiment is replaced by a WDM element 61. As shown in FIG. 18, the WDM element 61 has four ports P1 through P4. The first port P1 is connected to the signal light receive part 23, and allows the received light having the wavelength $\lambda_3$ to pass therethrough. Hence, the structure shown in FIG. 18 does not need the first band-pass filter 37. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40, and allows the exciting light of the wavelength $\lambda_2$ to pass therethrough. Hence, the second band-pass filter 39 used in the structure shown in FIGS. 2 and 3 is not needed in the structure shown in FIG. 18. The fourth port P4 is connected to the optical fiber cable 24, and allows the signal lights having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$, and $\lambda_3$ differ from each other.

The operation of the variation shown in FIG. 18 is the same as that of the aforementioned first embodiment of the present invention.

Figure 19:
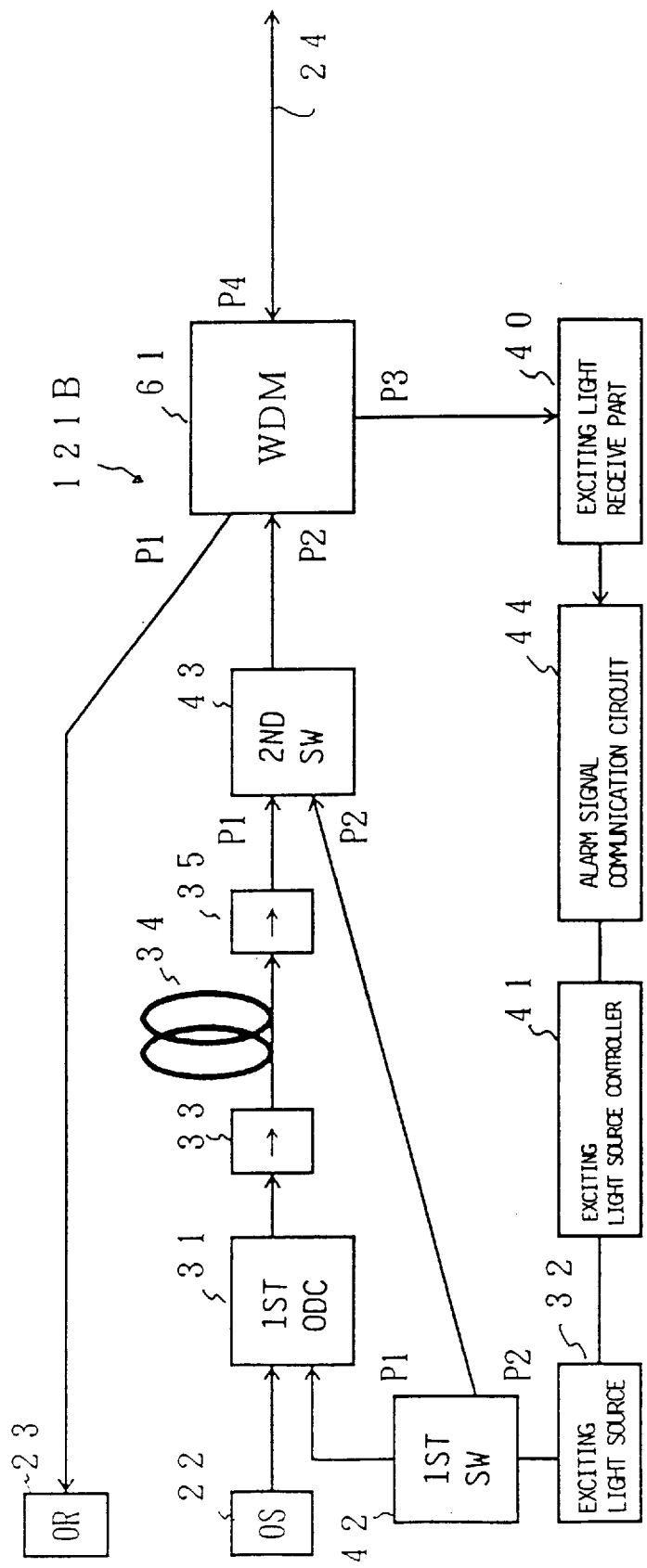
FIG. 19 is a block diagram of a variation of the transmission device according to the second embodiment of the present invention.

FIG. 19 is a block diagram of a transmission device 121B according a variation of the second embodiment of the present invention. In FIG. 19, parts that are the same as those shown in the previously described figures are given the same reference numbers. The structure shown in FIG. 19 employs the WDM element 61 instead of the third coupler 38. The first port P1 of the WDM element 61 is connected to the signal light receive part 23, and allows the received light having the wavelength $\lambda_3$ to pass therethrough. Hence, the structure shown in FIG. 19 does not need the first band-pass filter 37 shown in FIG. 4. The second port P2 is connected to the second optical switch 43, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 19 does not need the second band-pass filter 39 used in the structure shown in FIG. 4. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 19 is the same as that of the aforementioned second embodiment of the present invention.

Figure 20:
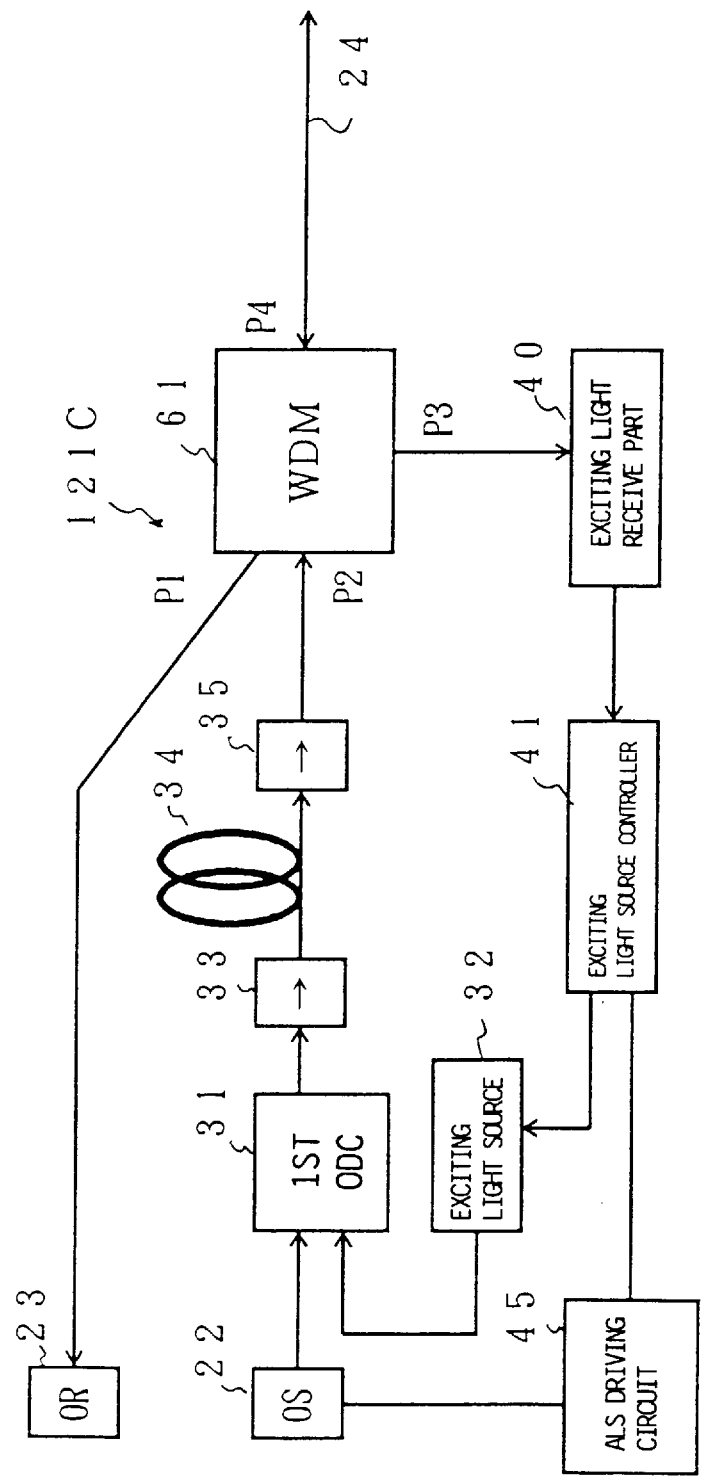
FIG. 20 is a block diagram of a variation of the transmission device according to the third embodiment of the present invention.

FIG. 20 is a block diagram of a transmission device 121C according a variation of the third embodiment of the present invention. In FIG. 20, parts that are the same as those shown in the previously described figures are given the same reference numbers. The structure shown in FIG. 20 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 20 does not need the first band-pass filter 37 shown in FIG. 5. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 20 does not need the second band-pass filter 39 used in the structure shown in FIG. 5. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 20 is the same as that of the aforementioned third embodiment of the present invention.

Figure 21:
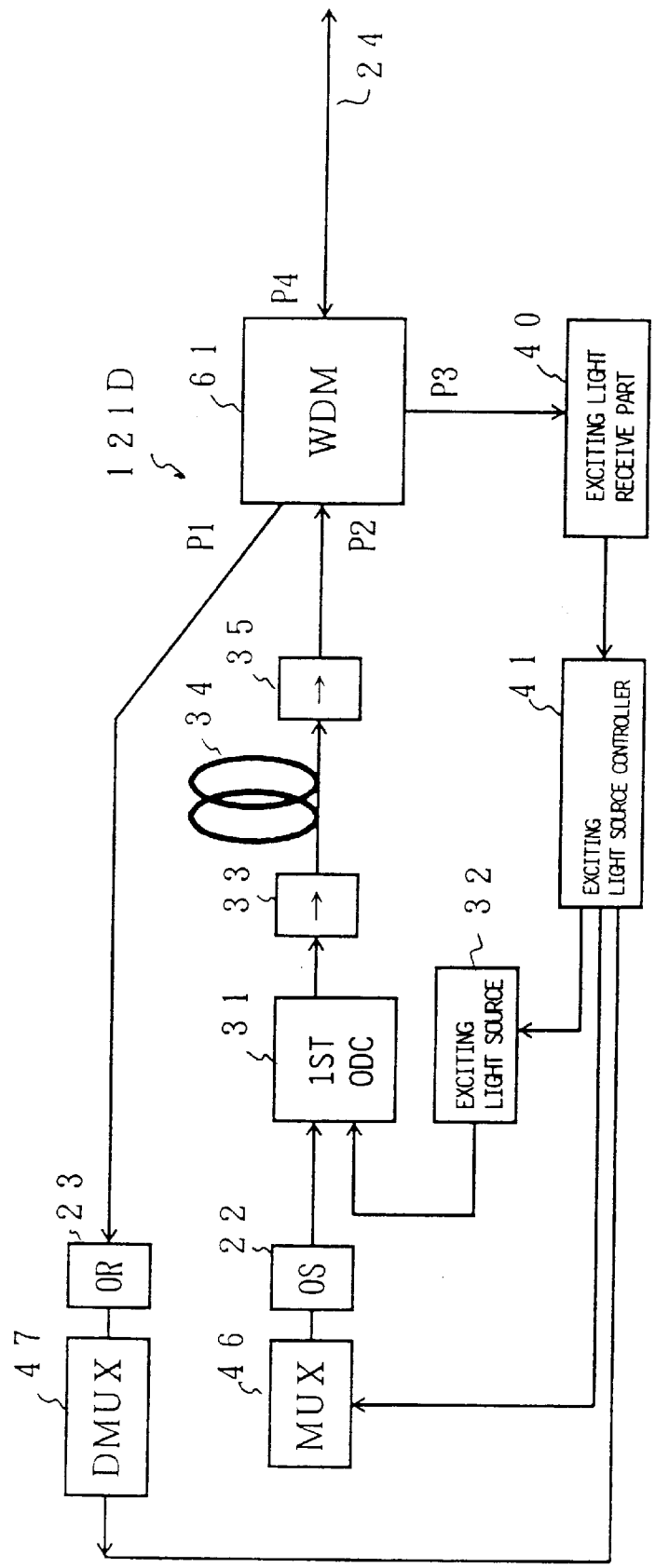
FIG. 21 is a block diagram of a variation of the transmission device according to the fourth embodiment of the present invention.

FIG. 21 is a block diagram of a transmission device 121D according a variation of the fourth embodiment of the present invention. In FIG. 21, parts that are the same as those shown in the previously described figures are given the same reference numbers. The structure shown in FIG. 21 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 21 does not need the first band-pass filter 37 shown in FIG. 6. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 21 does not need the second band-pass filter 39 used in the structure shown in FIG. 6. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 21 is the same as that of the aforementioned fourth embodiment of the present invention.

Figure 22:
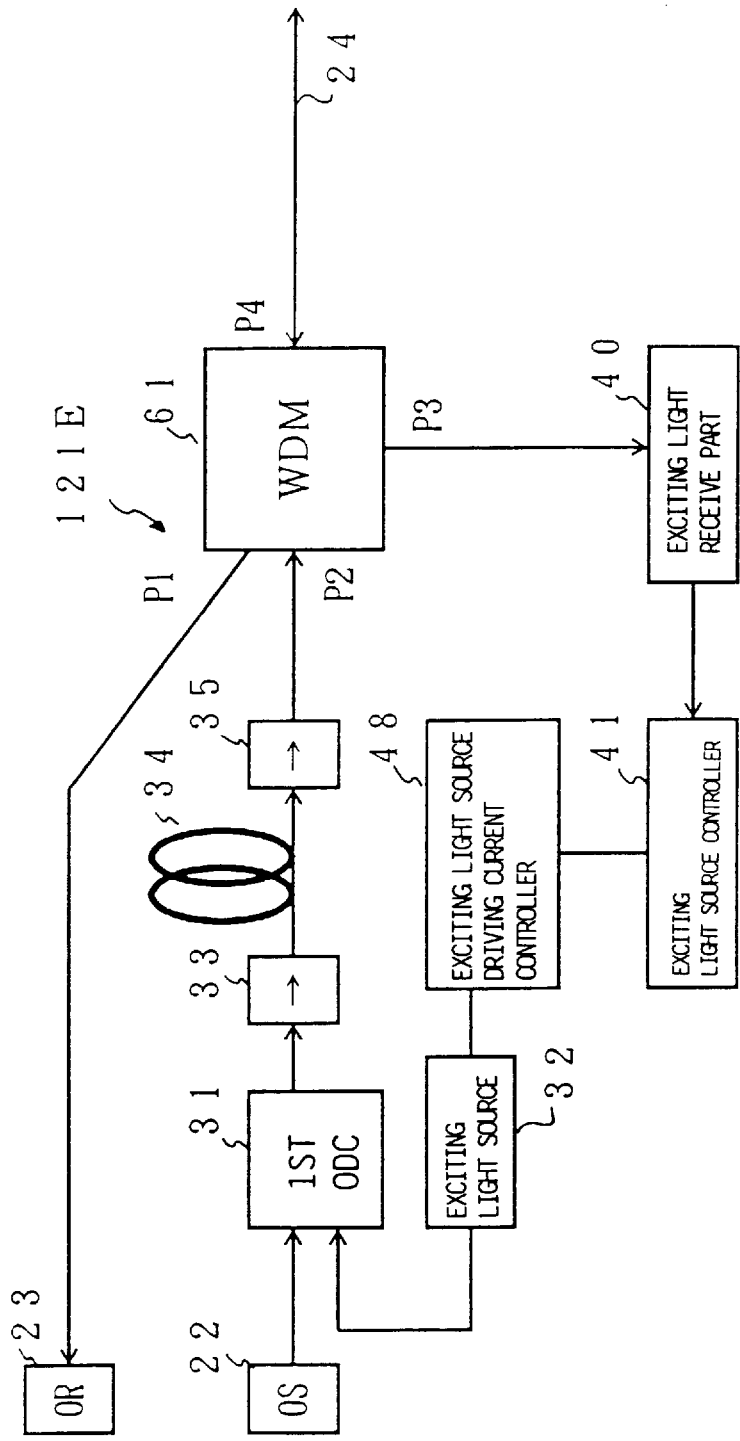
FIG. 22 is a block diagram of a variation of the transmission device according to the fifth embodiment of the present invention.

FIG. 22 is a block diagram of a transmission device 121E according a variation of the fifth embodiment of the present invention. In FIG. 22, parts that are the same as those shown in the previously described figures are given the same reference numbers. The structure shown in FIG. 22 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 22 does not need the first band-pass filter 37 shown in FIG. 7. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 22 does not need the second band-pass filter 39 used in the structure shown in FIG. 7. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 22 is the same as that of the aforementioned fifth embodiment of the present invention.

Figure 23:
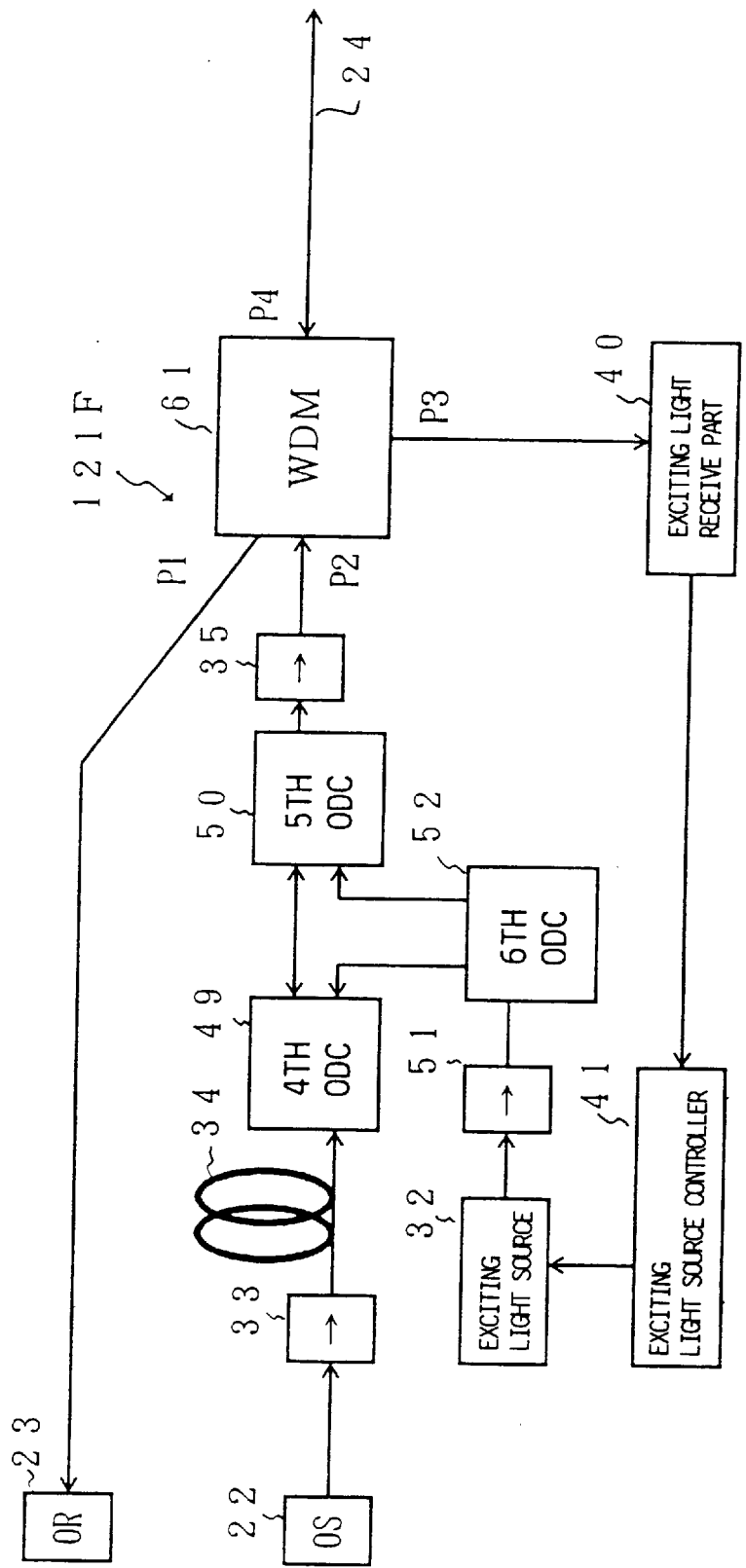
FIG. 23 is a block diagram of a variation of the transmission device according to the sixth embodiment of the present invention.

FIG. 23 is a block diagram of a transmission device 121F according a variation of the sixth embodiment of the present invention. In FIG. 23, parts that are the same as those shown in the previously described figures are given the same reference numbers. The structure shown in FIG. 23 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 23 does not need the first band-pass filter 37 shown in FIG. 7. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 23 does not need the second band-pass filter 39 used in the structure shown in FIG. 8. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 23 is the same as that of the aforementioned sixth embodiment of the present invention.

Figure 24:
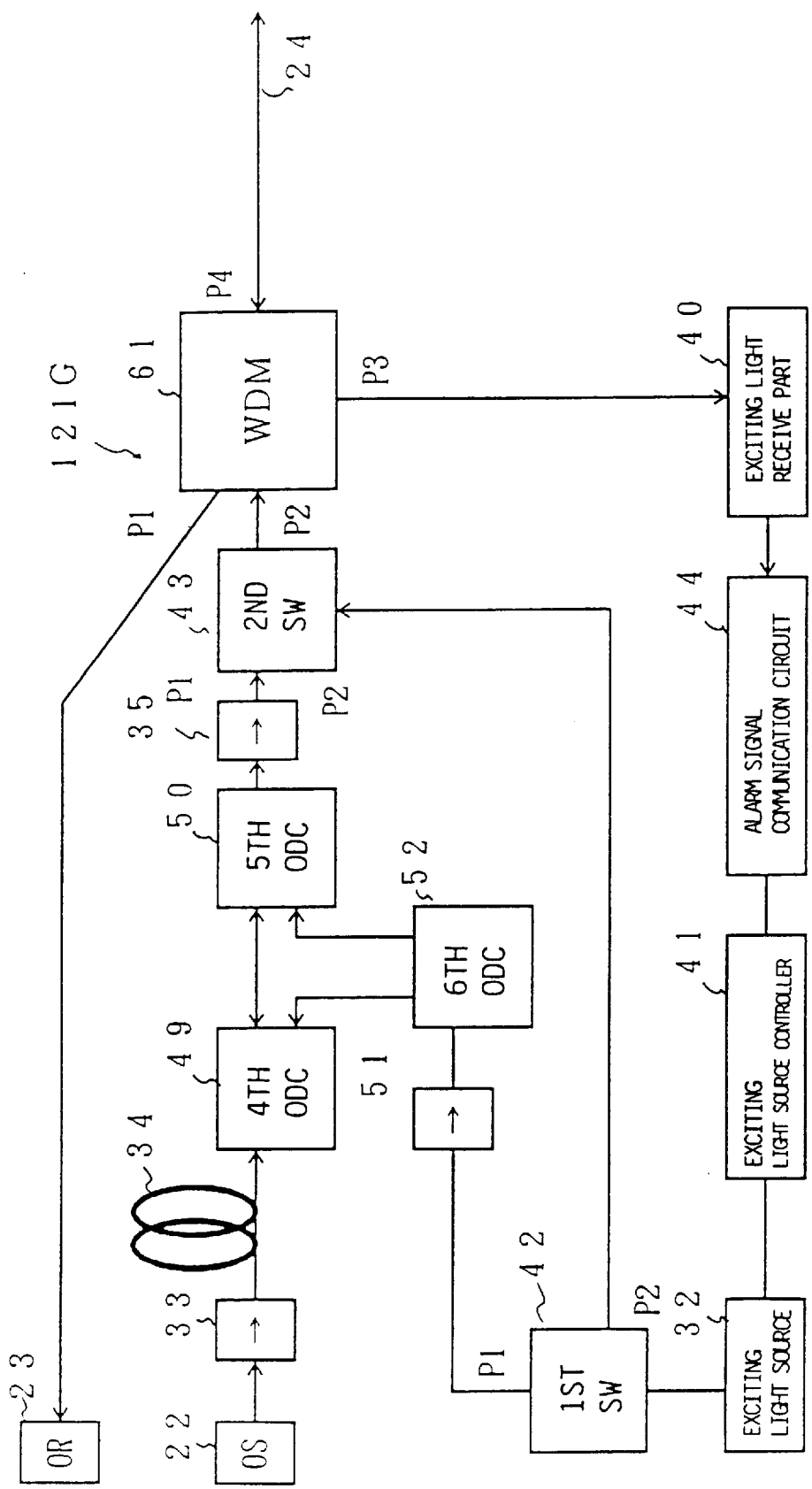
FIG. 24 is a block diagram of a variation of the transmission device according to the seventh embodiment of the present invention.

FIG. 24 is a block diagram of a transmission device 121G according a variation of the seventh embodiment of the present invention. In FIG. 24, parts that are the same as those shown in the previously described figures are given the same reference numbers. The structure shown in FIG. 24 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 24 does not need the first band-pass filter 37 shown in FIG. 9. The second port P2 is connected to the second optical switch 43, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 24 does not need the second band-pass filter 39 used in the structure shown in FIG. 9. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 24 is the same as that of the aforementioned seventh embodiment of the present invention.

Figure 25:
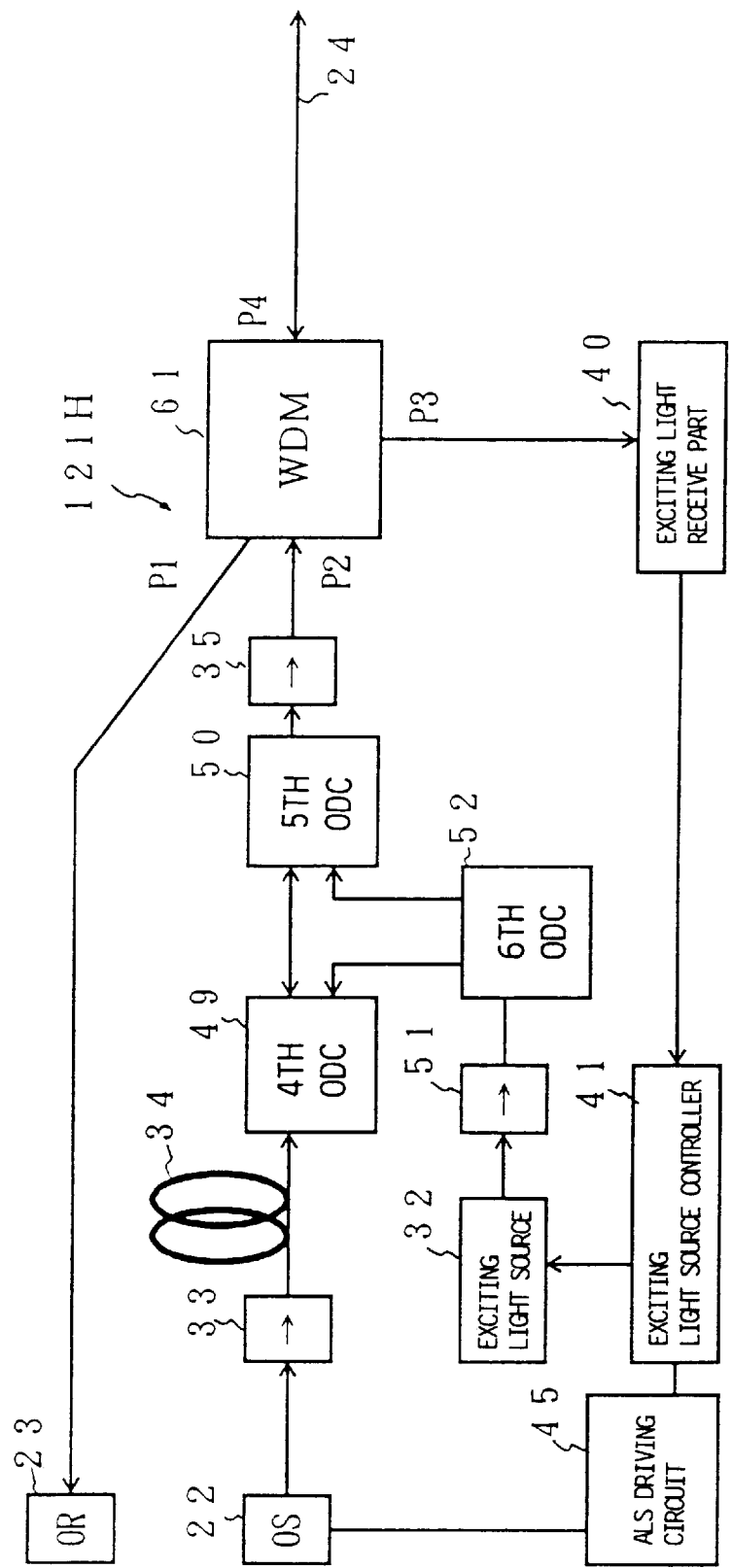
FIG. 25 is a block diagram of a variation of the transmission device according to the eighth embodiment of the present invention.

FIG. 25 is a block diagram of a transmission device 121H according a variation of the eighth embodiment of the present invention. In FIG. 25, parts that are the same as those shown in the previously described figures are given the same reference numbers. The structure shown in FIG. 25 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 24 does not need the first band-pass filter 37 shown in FIG. 10. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 25 does not need the second band-pass filter 39 used in the structure shown in FIG. 10. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 25 is the same as that of the aforementioned eighth embodiment of the present invention.

Figure 26:
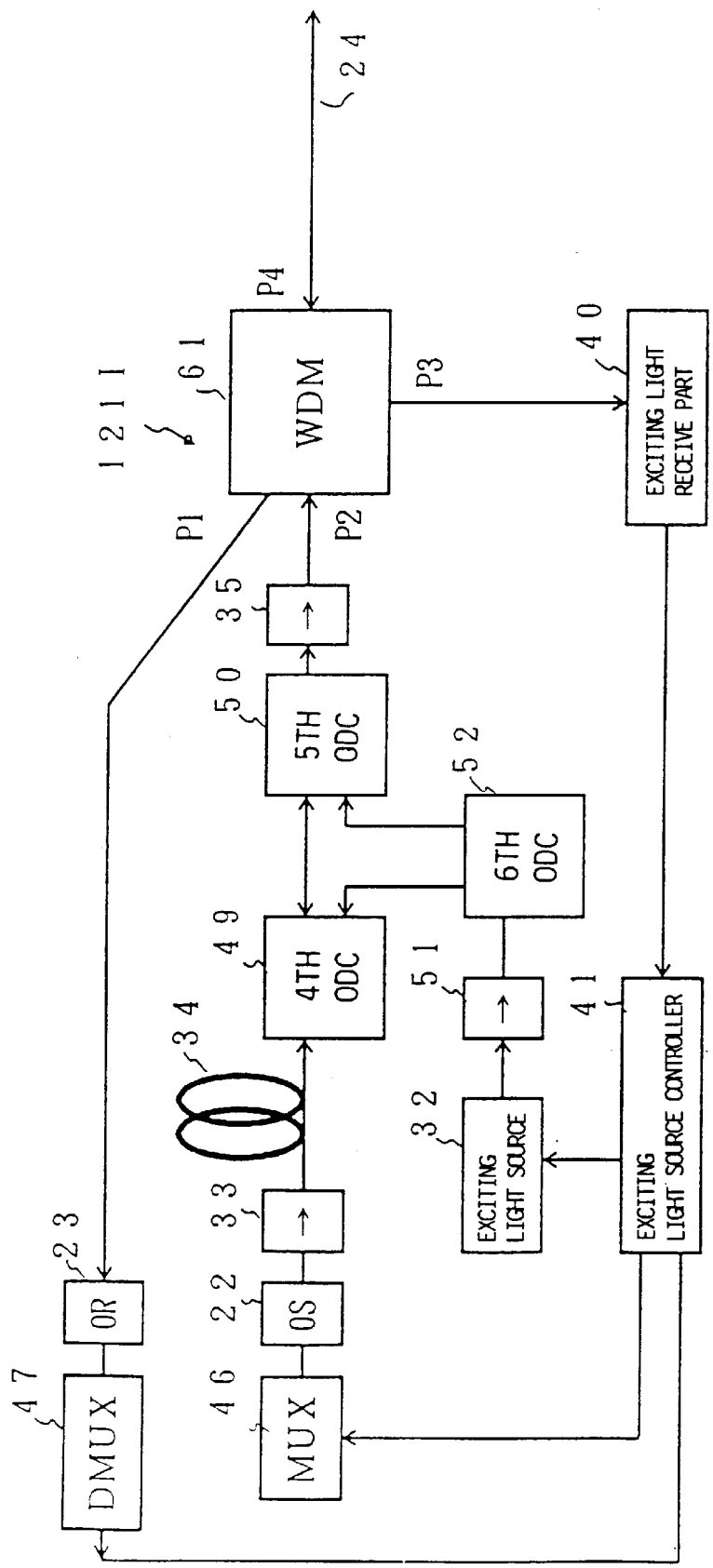
FIG. 26 is a block diagram of a variation of the transmission device according to the ninth embodiment of the present invention.

FIG. 26 is a block diagram of a transmission device 121I according a variation of the ninth embodiment of the present invention. In FIG. 26, parts that are the same as those shown in the previously described figures are given the same reference numbers. The structure shown in FIG. 26 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 26 does not need the first band-pass filter 37 shown in FIG. 11. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 26 does not need the second band-pass filter 39 used in the structure shown in FIG. 11. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 26 is the same as that of the aforementioned ninth embodiment of the present invention.

Figure 27:
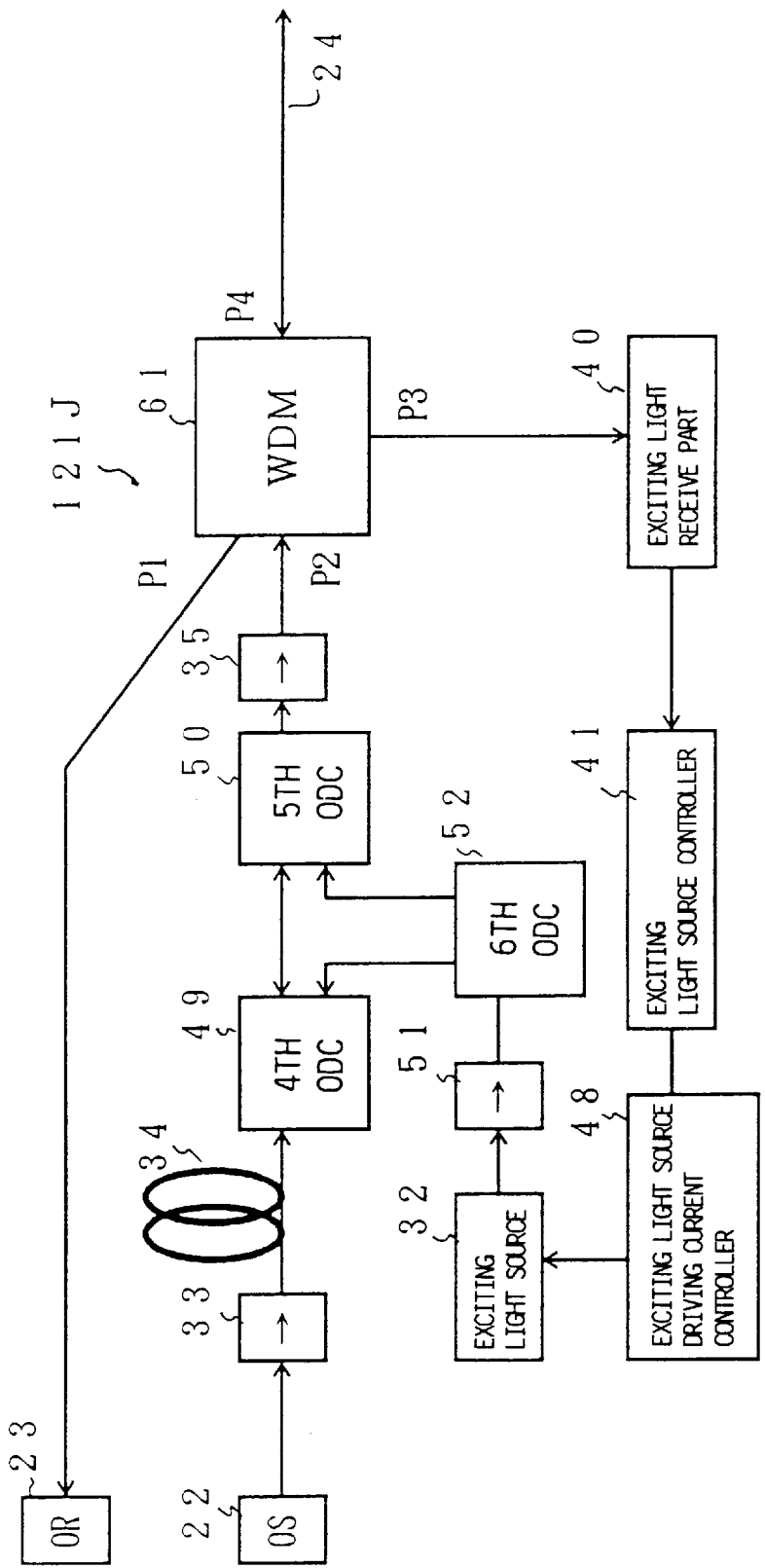
FIG. 27 is a block diagram of a variation of the transmission device according to the tenth embodiment of the present invention.

FIG. 27 is a block diagram of a transmission device 121J according a variation of the tenth embodiment of the present invention. In FIG. 27, parts that are the same as those shown in the previously described figures are given the same reference numbers. The structure shown in FIG. 27 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 27 does not need the first band-pass filter 37 shown in FIG. 12. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 27 does not need the second band-pass filter 39 used in the structure shown in FIG. 12. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 27 is the same as that of the aforementioned tenth embodiment of the present invention.

Figure 28:
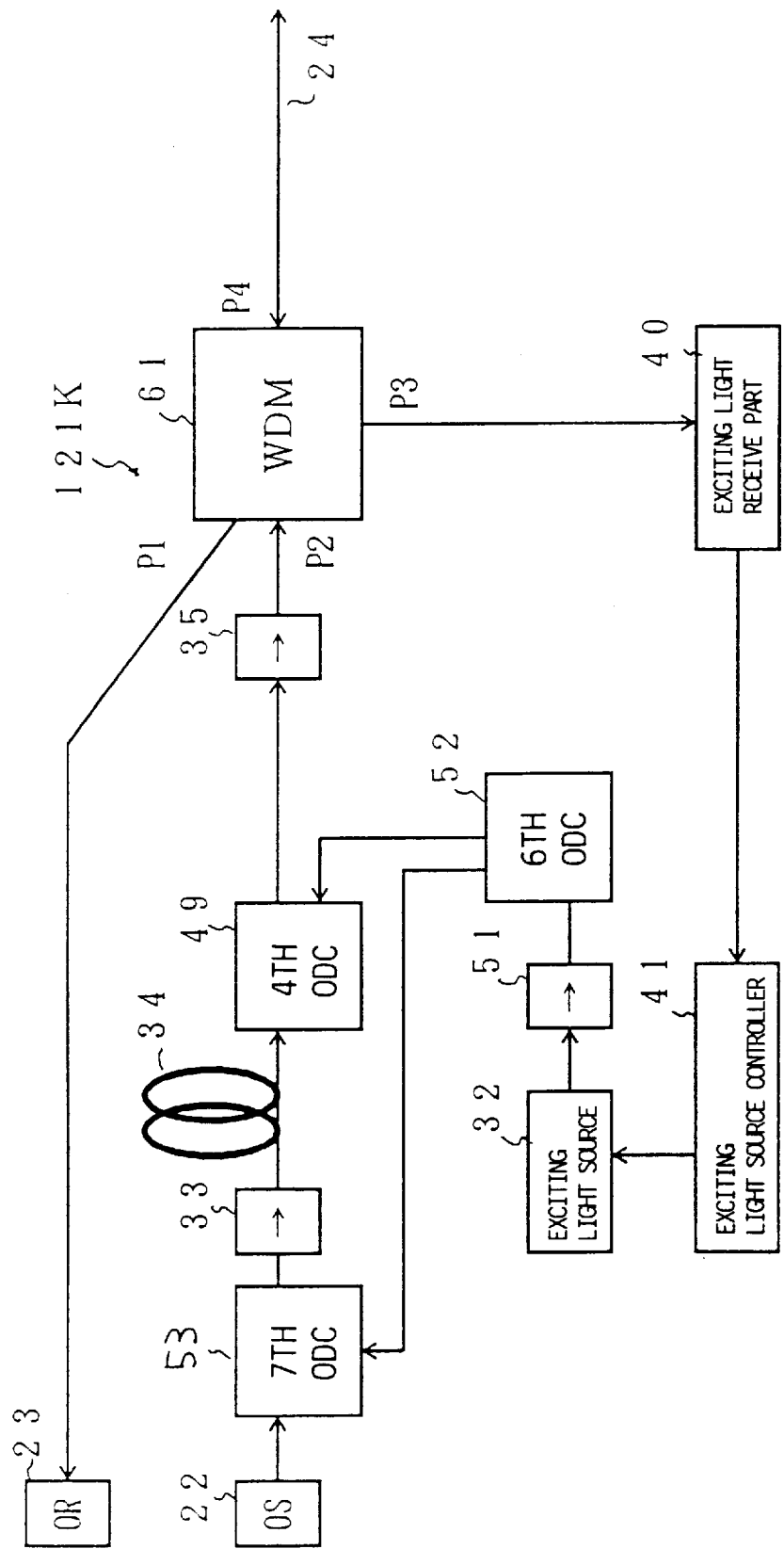
FIG. 28 is a block diagram of a variation of the transmission device according to the eleventh embodiment of the present invention.

FIG. 28 is a block diagram of a transmission device 121K according a variation of the eleventh embodiment of the present invention. In FIG. 28, parts that are the same as those shown in the previously described figures are given the same reference numbers. The structure shown in FIG. 28 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 28 does not need the first band-pass filter 37 shown in FIG. 13. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 28 does not need the second band-pass filter 39 used in the structure shown in FIG. 13. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 28 is the same as that of the aforementioned eleventh embodiment of the present invention.

Figure 29:
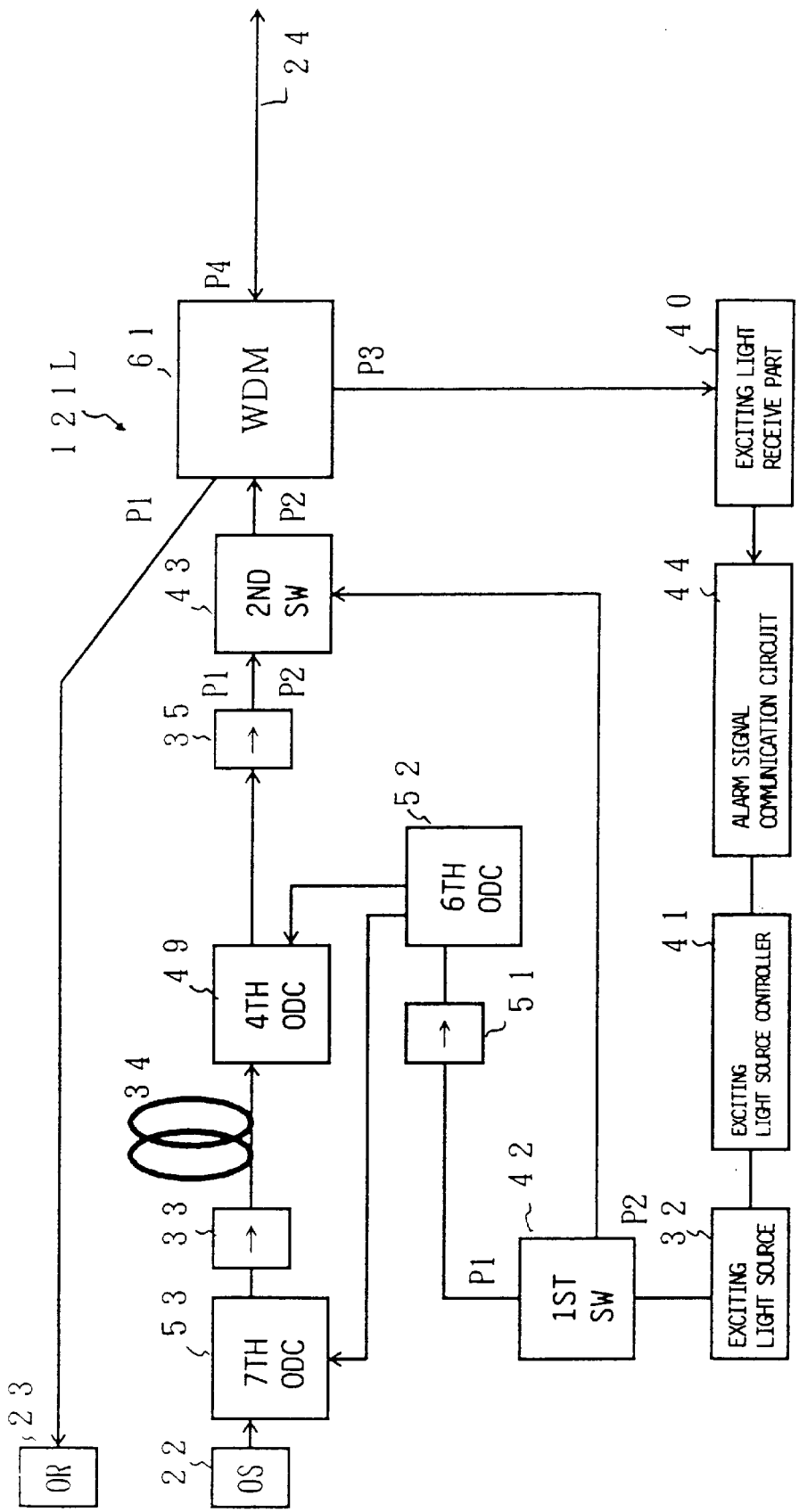
FIG. 29 is a block diagram of a variation of the transmission device according to the twelfth embodiment of the present invention.

FIG. 29 is a block diagram of a transmission device 121L according a variation of the twelfth embodiment of the present invention. In FIG. 29, parts that are the same as those shown in the previously described figures are given the same reference numbers. The structure shown in FIG. 29 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 29 does not need the first band-pass filter 37 shown in FIG. 14. The second port P2 is connected to the second optical switch 43, and allows the signal light having the wavelength $\lambda_1$ and the exciting light having the wavelength $\lambda_2$ to pass therethrough.

The third port P3 is connected to the exciting light receive part 40 and allows the exciting light of the wavelength $\lambda_2$ to pass therethrough. Hence, the structure shown in FIG. 29 does not need the second band-pass filter 39 used in the structure shown in FIG. 14. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 29 is the same as that of the aforementioned twelfth embodiment of the present invention.

Figure 30:
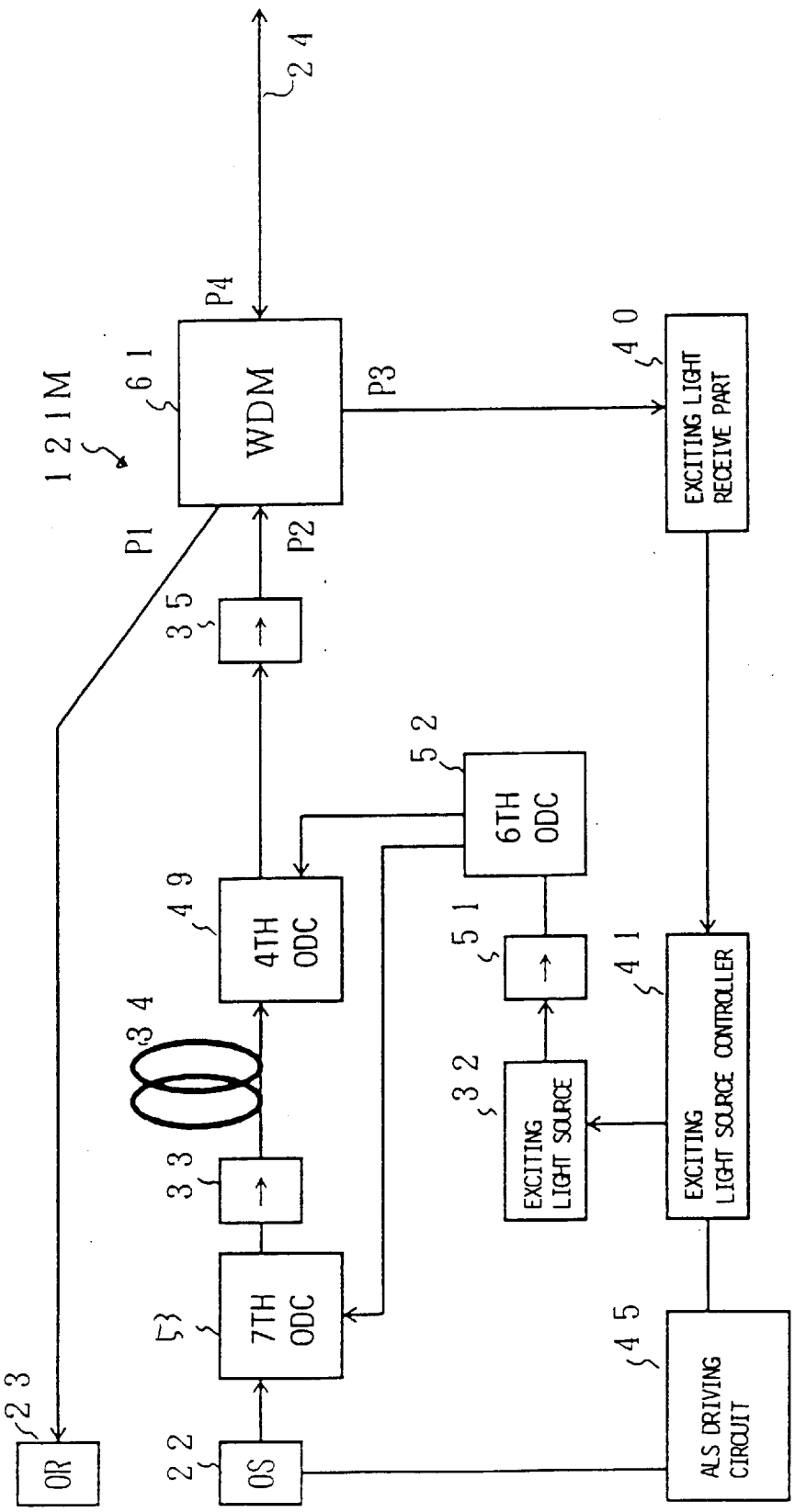
FIG. 30 is a block diagram of a variation of the transmission device according to the thirteenth embodiment of the present invention.

FIG. 30 is a block diagram of a transmission device 121M according a variation of the thirteenth embodiment of the present invention. In FIG. 30, parts that are the same as those shown in the previously described figures are given the same reference numbers. The structure shown in FIG. 30 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 30 does not need the first band-pass filter 37 shown in FIG. 15. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 30 does not need the second band-pass filter 39 used in the structure shown in FIG. 15. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 30 is the same as that of the aforementioned thirteenth embodiment of the present invention.

Figure 31:
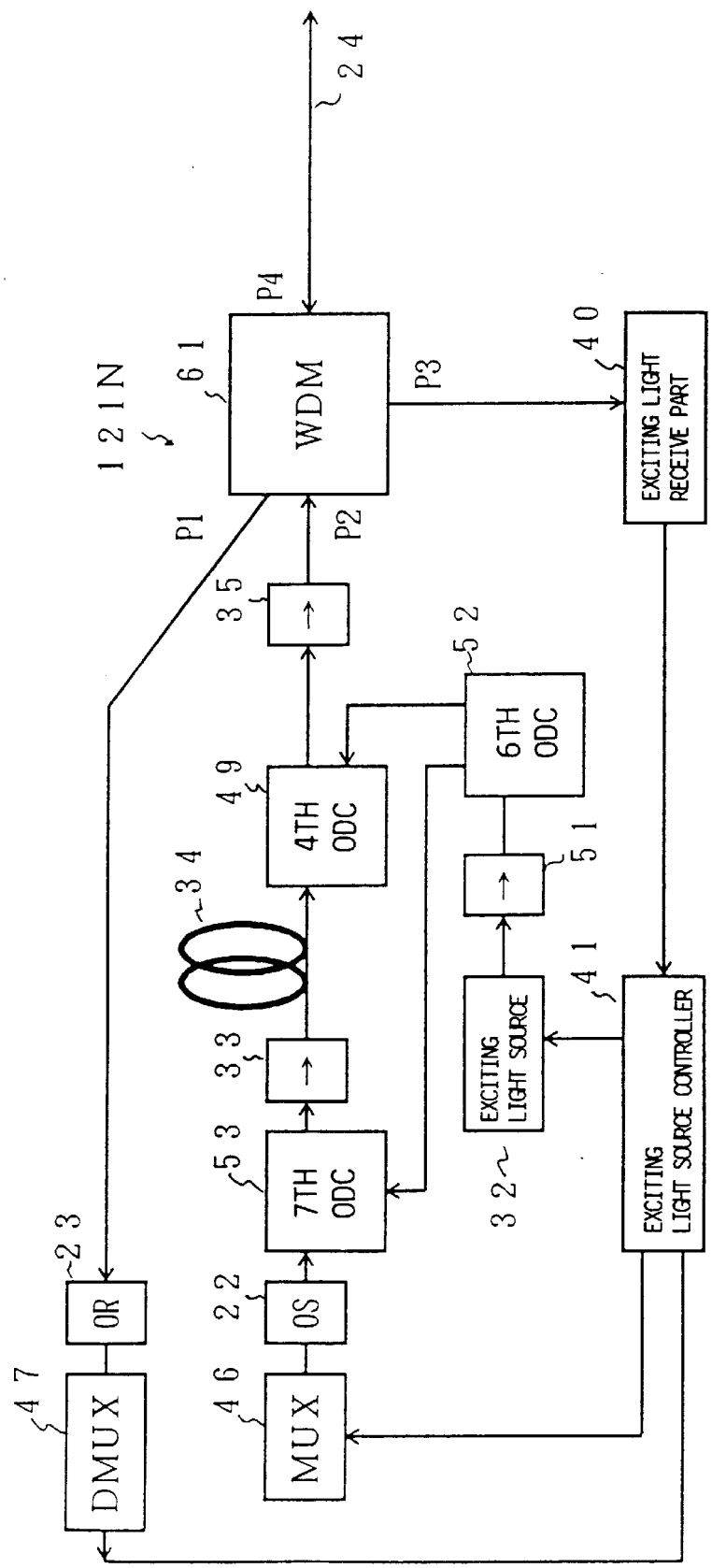
FIG. 31 is a block diagram of a variation of the transmission device according to the fourteenth embodiment of the present invention.

FIG. 31 is a block diagram of a transmission device 121N according a variation of the fourteenth embodiment of the present invention. In FIG. 31, parts that are the same as those shown in the previously described figures are given the same reference numbers. The structure shown in FIG. 31 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 31 does not need the first band-pass filter 37 shown in FIG. 16. The second port P2 is connected to the second optical isolator 35, and allows the signal light having the wavelength $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 31 does not need the second band-pass filter 39 used in the structure shown in FIG. 16. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 31 is the same as that of the aforementioned fourteenth embodiment of the present invention.

Figure 32:
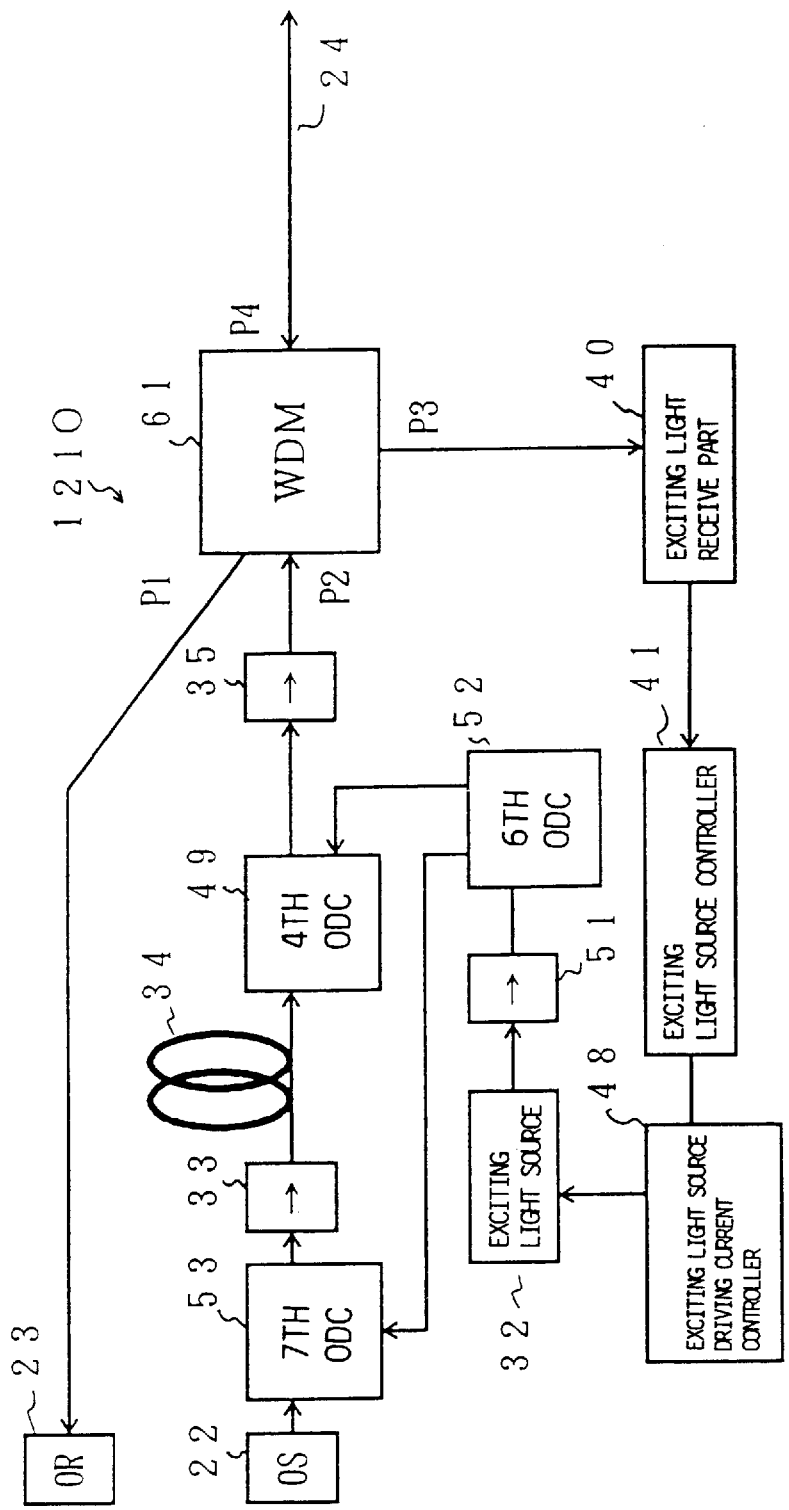
FIG. 32 is a block diagram of a variation of the transmission device according to the fifteenth embodiment of the present invention.

FIG. 32 is a block diagram of a transmission device 121O according a variation of the fifteenth embodiment of the present invention. In FIG. 32, parts that are the same as those shown in the previously described figures are given the same reference numbers. The structure shown in FIG. 32 employs the WDM element 61 instead of the second coupler 36 and the third coupler 38. The first port P1 of the WDM element 61 is connected to the signal light receive part 23, and allows the received light having the wavelength $\lambda_3$ to pass therethrough. Hence, the structure shown in FIG. 32 does not need the first band-pass filter 37 shown in FIG. 17. The second port P2 is connected to the second optical isolator 35, and allows the signal light having the wavelengths $\lambda_1$ and the exciting light having the wavelength $\lambda_2$ to pass therethrough. The third port P3 is connected to the exciting light receive part 40 and allows the exciting light of the wavelength $\lambda_2$ to pass therethrough. Hence, the structure shown in FIG. 32 does not need the second band-pass filter 39 used in the structure shown in FIG. 17. The fourth port P4 is connected to the optical fiber cable 24, and allows the signal lights respectively having the wavelengths $\lambda_1$ and $\lambda_3$ and the exciting light having the wavelength $\lambda_2$ to pass therethrough. As has been described, the wavelength $\lambda_2$ of the exciting light differs from the wavelengths $\lambda_1$ and $\lambda_3$ and the wavelength of the exciting light used in the remote transmission device. Of course, it is required that the wavelengths $\lambda_1$ and $\lambda_3$ differ from each other.

The operation of the variation shown in FIG. 32 is the same as that of the aforementioned fifteenth embodiment of the present invention.

A description will now be given of the details of the blocks in the aforementioned embodiments of the present invention and the variations thereof.

Figure 33:
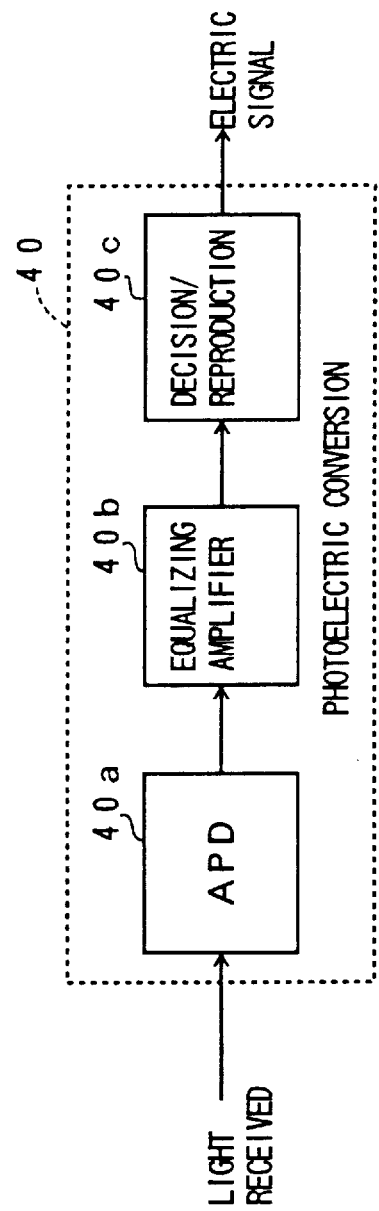
FIG. 33 is a block diagram of an exciting light receive part used in the embodiments of the present invention and the variations thereof.

FIG. 33 is a block diagram of the exciting light receive part 40, which is made up of an avalanche photodiode (APD) 40a, an equalizing amplifier 40b and a decision and reproduction part 40c. The APD 40a converts the received light (which is the exciting light having the wavelength $\lambda_2$) into an electric signal. The equalizing amplifier 40b performs an equalizing and amplifying operation on the electric signal. The decision and reproduction part 40c performs a decision and reproduction operation on the output signal of the equalizing amplifier 40b. The blocks 40a, 40b and 40c themselves can respectively be realized by the known art.

Figure 34:
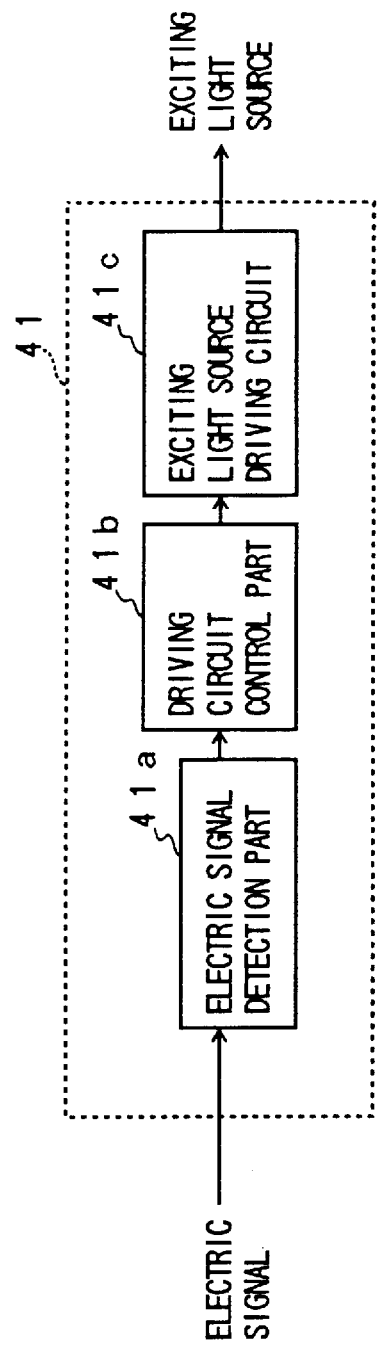
FIG. 34 is a block diagram of an exciting light source controller shown in FIGS. 2, 3, 8, 13, 18, 23 and 28.

FIG. 34 is a block diagram of the exciting light source controller 41 shown in FIGS. 2, 3, 8, 13, 18, 23 and 28. The exciting light controller 41 includes an electric signal detection part 41a, a driving circuit control part 41b and an exciting light source driving circuit 41c. When the electric signal detection part 41a detects the input electric signal from the exciting light receive part 40, it stops driving the driving circuit control part 41b. Then, the driving circuit control part 41b cuts off the bias current of the exciting light source 32 supplied by the exciting light source driving circuit 41c. When no electric signal is detected, the above control is not performed. The blocks 41a, 41b and 41c themselves can respectively be realized by the known art.

Figure 35:
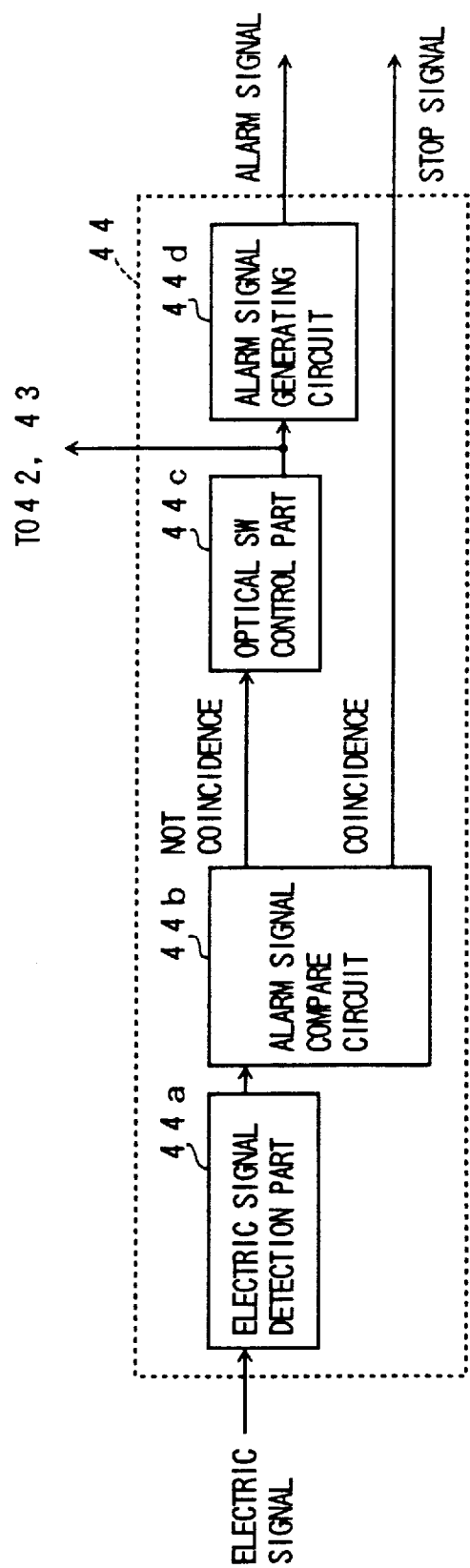
FIG. 35 is a block diagram of an alarm signal communication circuit shown in FIGS. 4, 9, 14, 19, 24 and 29.

FIG. 35 is a block diagram of the alarm signal communication circuit 44 shown in FIGS. 4, 9, 14, 19, 24 and 29. The alarm signal communication circuit 44 includes an electric signal detection part 44a, an alarm signal compare circuit 44b, an optical switch control part 44c and an alarm signal generating circuit 44d. When the electric signal detection part 44a detects an electric signal from the exciting light receive part 40, the alarm signal compare circuit 44b outputs a non-coincidence signal to the optical switch control part 44c. In response to the non-coincidence signal, the optical switch control part 44c controls the first optical switch 42 and the second optical switch 43 to select the respective terminals P2. In response to the above control, the alarm signal generating circuit 44d generates the alarm signal. The exciting light source controller 41 modulates the exciting light of the exciting light source 32 in accordance with the alarm signal. The light reflected by the broken end surface of the optical fiber cable 24 is received by the exciting light receive part 40, and is detected by the electric signal detection part 44a. The alarm signal compare circuit 44b compares the pattern of the received alarm signal with the pattern of the transmitted alarm signal. When the patterns coincide with each other, the alarm signal compare circuit 44b outputs the exciting light stop signal to the exciting light source controller 41. The blocks 44a, 44b, 44c and 44d themselves can respectively be realized by the known art.

Figure 36:
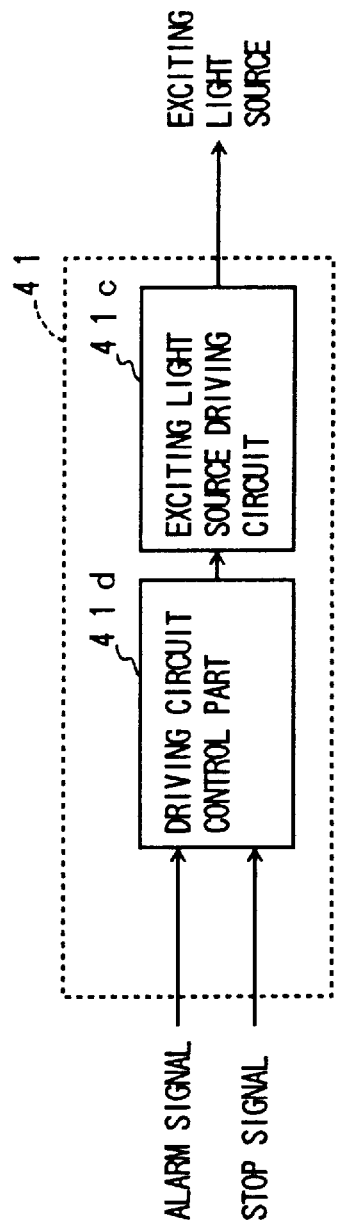
FIG. 36 is a block diagram of an exciting light source controller shown in FIGS. 4, 9, 14, 19, 24 and 29.

FIG. 36 is a block diagram of the exciting light source controller 41 shown in FIGS. 4, 9, 14, 19, 24 and 29. The exciting light source controller 41 includes a driving circuit control part 41d and the exciting light source driving circuit 41c. The driving circuit control part 41d receives the alarm signal and the exciting light stop signal from the alarm signal communication circuit 44. When the alarm signal is received, the driving circuit control part 41d drives the exciting light source driving circuit 41c to modulate the exciting light output by the exciting light source 32. When the exciting light stop signal is received, the driving circuit control part 41d controls the exciting light source drive circuit 41c to stop driving the exciting light source 32. For example, the bias current flowing in the exciting light source 32 is cut off. The blocks 41c and 41d themselves can respectively be realized by the known art.

Figure 37:
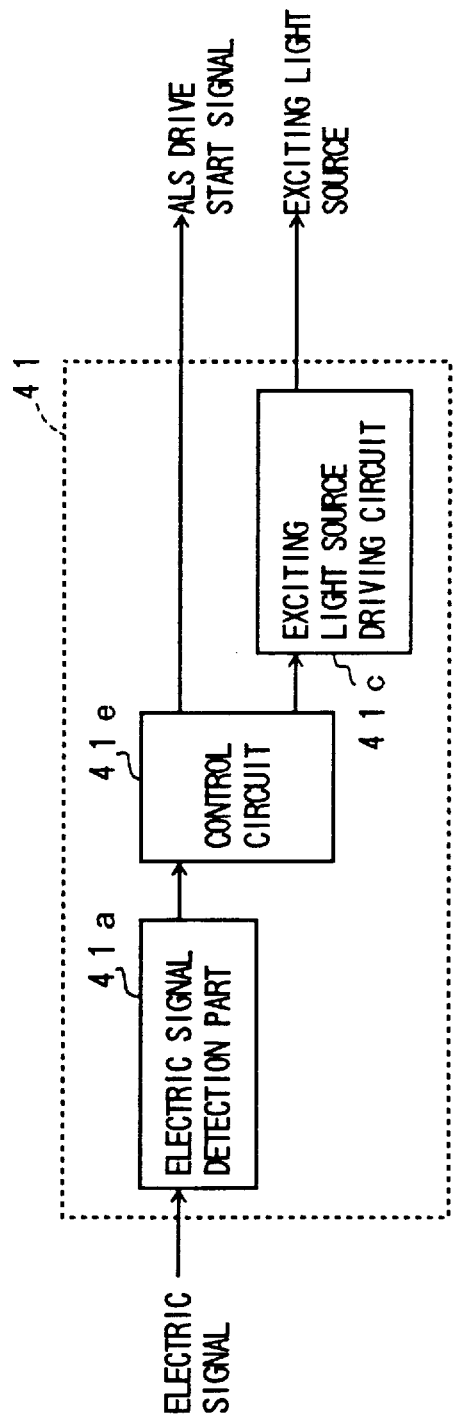
FIG. 37 is a block diagram of an exciting light source controller shown in FIGS. 5, 10, 15, 20, 25 and 30.

FIG. 37 is a block diagram of the exciting light source controller 41 shown in FIGS. 5, 10, 15, 20, 25 and 30. The exciting light source controller 41 includes the electric signal detection part 41a, a control circuit 41e and the exciting light source driving circuit 41c. When the electric signal detection part 41a detects the electric signal, the control circuit 41e outputs an ALS drive start signal to the ALS driving circuit 45. During a given period in which the ALS driving circuit 45 causes the signal light transmit part 22 to output the signal light, the control circuit 41e controls the exciting light source driving circuit 41c so that the exciting light source 32 stops outputting the exciting light during the same period as described above. After the given period, the outputting of the signal light and the exciting light is restarted under the control of the control circuit 41e. If the electric signal is still detected after the given period due to a break in the optical fiber cable 24, the above operation is carried out again. The above operation is repeatedly carried out until no electric signal is detected. The blocks 41a, 41c and 41e can respectively be realized by the known art.

Figure 38:
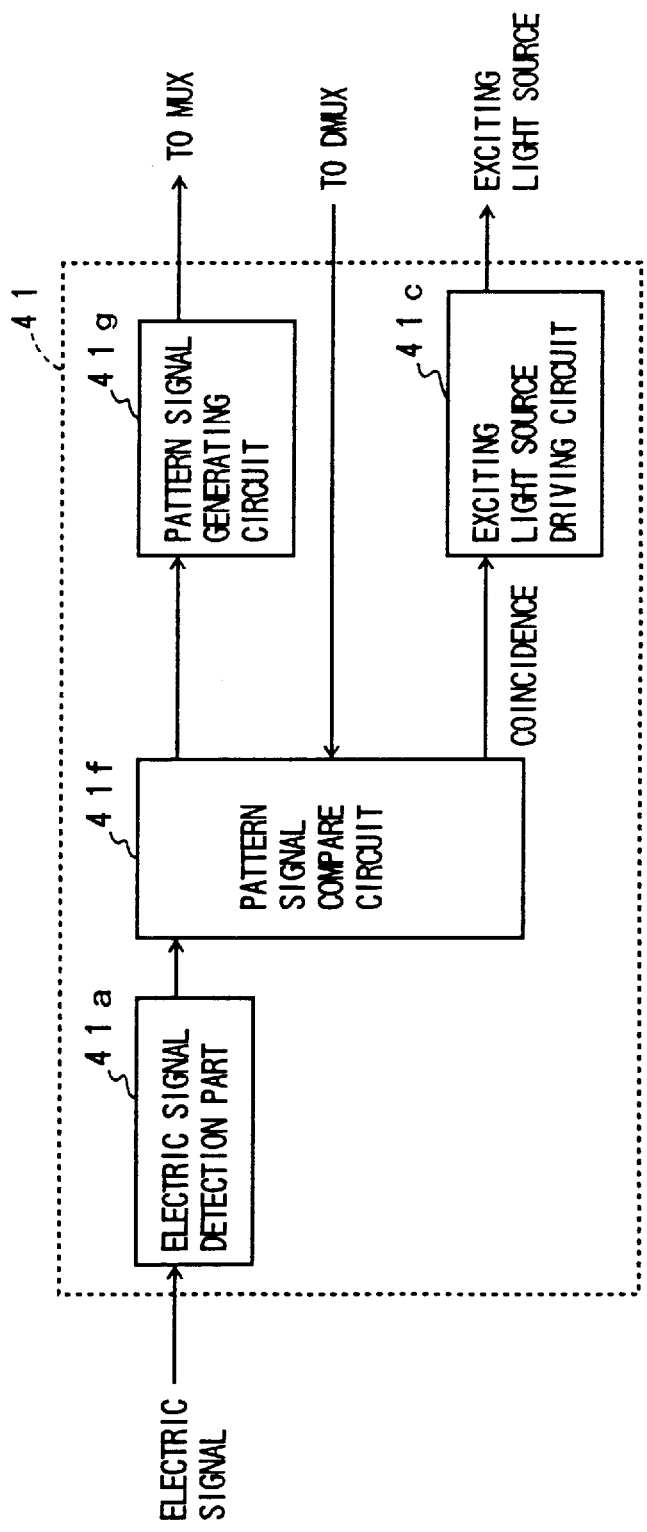
FIG. 38 is a block diagram of an exciting light source controller shown in FIGS. 6, 11, 16, 26 and 31.

FIG. 38 is a block diagram of the exciting light source controller 41 shown in FIGS. 6, 11, 16, 26 and 31. The exciting light source controller 41 shown in FIG. 38 includes the electric signal detection part 41a, a pattern signal compare circuit 41f, a pattern signal generating circuit 41g and the exciting light source driving circuit 41c. When the electric signal detection part 41a detects the electric signal, the pattern signal generating circuit 41g is notified of the detection of the electric signal via the pattern signal compare circuit 41f, and outputs a pattern signal having an arbitrary pattern to the signal multiplexer 46. The pattern signal compare circuit 41f compares the electric signal received by the exciting light receive part 40 with the signal extracted by the signal demultiplexer 47. When both the patterns coincide with each other, the pattern signal compare circuit 41f controls the exciting light source driving circuit 41c to stop the output operation of the exciting light source 32. The blocks 41a, 41c, 41f and 41g themselves can respectively be realized by the known art.

Figure 39:
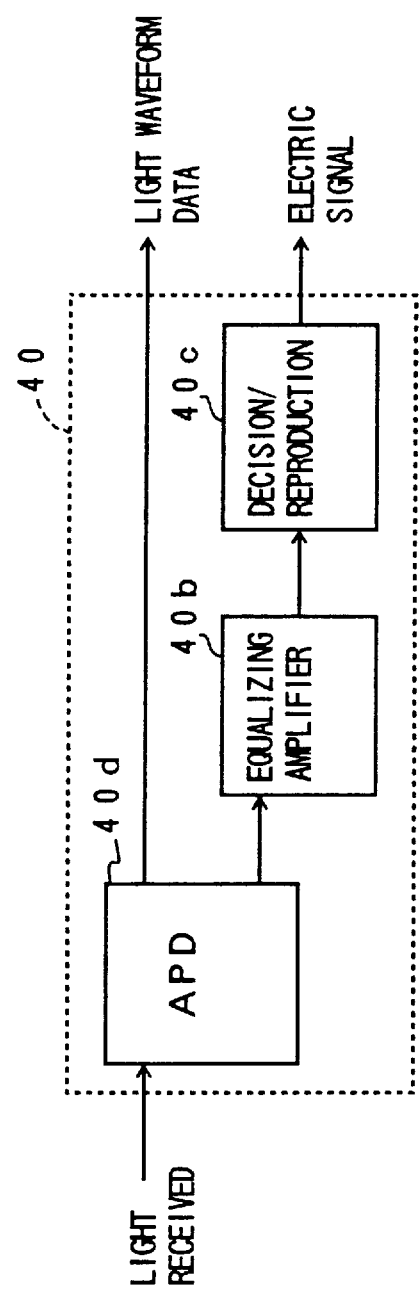
FIG. 39 is a block diagram of an exciting light receive part shown in FIGS. 7, 12, 17, 22, 27 and 32.

FIG. 39 is a block diagram of the exciting light receive part shown in FIGS. 7, 12, 17, 22, 27 and 32. The exciting light receive part 40 includes the APD 40d, the equalizing amplifier 40b and the decision and reproduction part 40c. Data indicative of the waveform of the light signal received by the APD 40d is output to the exciting light controller 41. This differs from the structure shown in FIG. 33.

Figure 40:
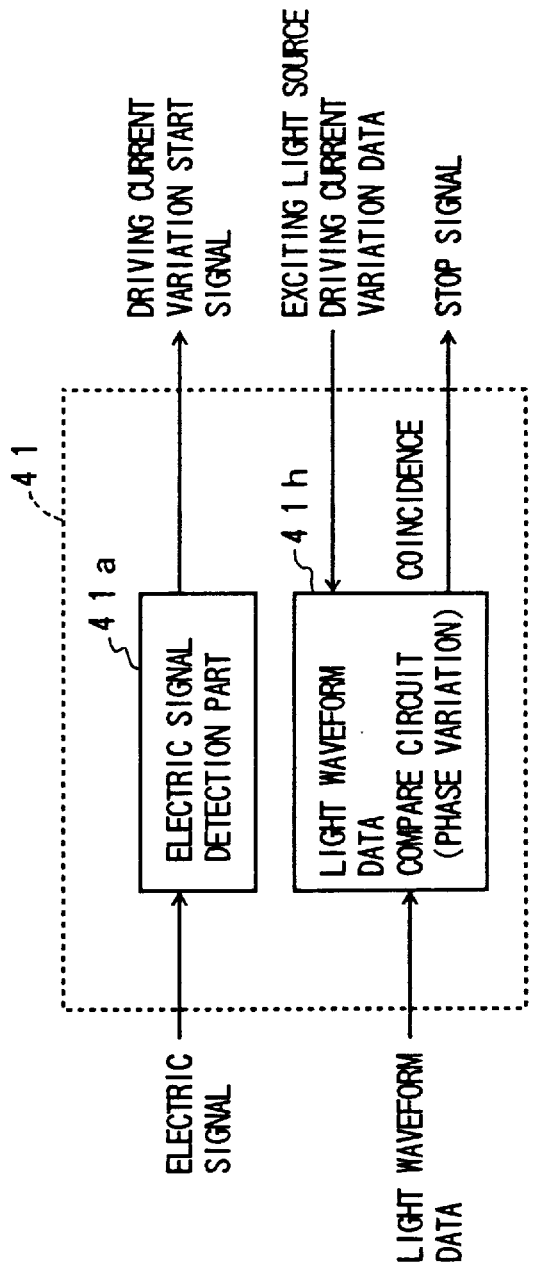
FIG. 40 is a block diagram of an exciting light source controller shown in FIGS. 7, 12, 17, 22, 27 and 32.

FIG. 40 is a block diagram of the exciting light source controller 41 shown in FIGS. 7, 12, 17, 22, 27 and 32. The exciting light source controller 41 includes the electric signal detection part 41a and a light waveform data compare circuit 41h. When the electric signal detection part 41a detects the electric signal, it outputs a signal which starts to vary the current flowing in the exciting light source 32. Thereafter, the light waveform data compare circuit 41h compares light waveform data supplied from the exciting light receive part 40 with data supplied from the exciting light source driving current controller 48. When a data coincidence is obtained, the compare circuit 41h causes the exciting light source 32 to stop outputting the exciting light by sending a corresponding signal to the controller 48.

Figure 41:
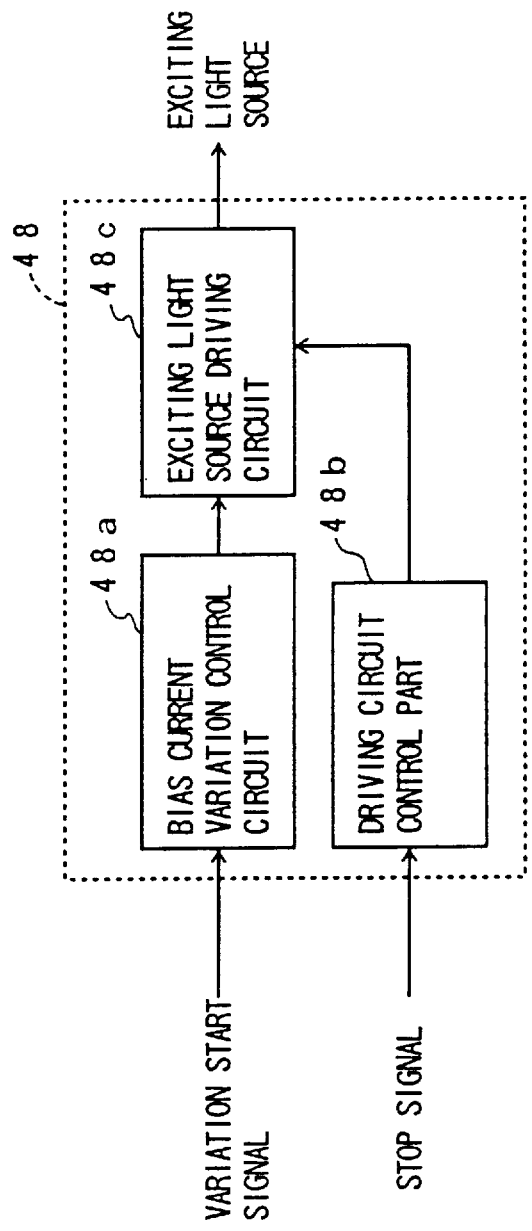
FIG. 41 is a block diagram of a light source driving current controller shown in FIGS. 7, 12, 17, 22, 27 and 32.

FIG. 41 is a block diagram of the exciting light source driving current controller 48 shown in FIGS. 7, 12, 17, 22, 27 and 32. The controller 48 includes a bias current variation control circuit 48a, a driving current control part 48b and an exciting light source driving circuit 48c. When the bias current variation control circuit 48a receives the signal which starts to vary the current flowing in the exciting light source 32, it starts to vary the bias current of the exciting light source 32, and supplies the exciting light source control part 41 with data concerning the period of the variation and the amount of the bias current. When the signal which stops outputting the exciting light is received, the driving circuit control part 48b controls the exciting light source driving circuit 48c so that the exciting light source 32 stops outputting the exciting light.

The present invention is not limited to the specifically disclosed embodiments and variations, and other variations and modifications can be made without departing from the scope of the present invention.

What is claimed is:

1. A transmission device comprising:

an exciting light source outputting an exciting light;

a first optical part which supplies an optical amplifying part with a signal light and the exciting light, said optical amplifying part forming an amplified light from said signal light and said exciting light;

a second optical part which supplies said amplified light to an optical transmission line and receives a light via the optical transmission line; and a control part which determines whether the light received from the optical transmission line includes the exciting light output by the exciting light, and controls the exciting light source to stop outputting the exciting light, when it is determined that the light received from the optical transmission line includes the exciting light output by the exciting light source.

2. The transmission device as claimed in claim 1, wherein the first optical part is provided at an output side of the optical amplifying part and supplies the exciting light from the exciting light source to the optical amplifying part and the optical transmission line.

3. The transmission device as claimed in claim 1, further comprising:

a first part which causes the exciting light source to generate a modulated light signal having a given pattern when it is determined that the light received includes the exciting light and determines whether the light received includes the modulated light signal having the given pattern; and a switch part which supplies the modulated signal to the optical transmission line without supplying the modulated light signal to the optical amplifier part, the first part causing the exciting light source to stop outputting any light when it is determined that the received light includes the modulated light signal having the given pattern.

4. The transmission device as claimed in claim 1, wherein said control part causes the signal light to stop being output to the optical transmission line.

5. The transmission device as claimed in claim 1, further comprising a multiplexer/demultiplexer part which inserts a given pattern into the signal light when it is determined that the light received includes the exciting light and extracts the given pattern from the light received, said control part causing the exciting light source to stop outputting the exciting light when the given pattern is extracted from the light received.

6. The transmission device as claimed in claim 1, further comprising:

a first part which causes the exciting light source to vary a magnitude of the exciting light by changing a bias current flowing in the exciting light source when it is determined that the light received includes the exciting light and determines whether the light received includes the exciting light having a level corresponding to a varied magnitude; and the first part causing the exciting light source to stop outputting any light when it is determined that the light received includes the exciting light having the level corresponding to the varied magnitude.

7. The transmission device as claimed in claim 1, wherein said first part is provided at an input side of the optical amplifying part and supplies the exciting light from the exciting light source to the optical amplifying part and the optical transmission line.

8. The transmission device as claimed in claim 1, wherein said first and second parts include respective optical directional couplers.

9. The transmission device as claimed in claim 1, wherein said first part includes an optical directional coupler, and the second part includes a wavelength division multiplexer.

10. The transmission device as claimed in claim 1, wherein the exciting light has a wavelength different from that of the signal light.

11. The transmission device as claimed in claim 1, wherein the exciting light output by said exciting light source has a wavelength different from that of another exciting light used in a remote transmission device coupled to said transmission device in a two-way formation.

12. An optical transmission system comprising:

a first transmission device; and a second transmission device coupled, via an optical transmission medium, to the first transmission device in a two-way formation, wherein the first transmission device includes an exciting light source outputting an exciting light, a first optical part which supplies an optical amplifying part with a signal light and the exciting light, a second optical part which supplies an optical amplifying part with a signal light and the exciting light, a second optical part which supplies an amplified light to the optical transmission medium and receives a light via the optical transmission medium, and a control part which determines whether the light received by the second optical part includes the exciting light output by the exciting light source, and controls the exciting light source to stop outputting the exciting light when the light received by the second optical part includes the exciting light output by the exciting light source.

13. The optical transmission device as claimed in claim 12, wherein the exciting light output by said exciting light source of the first transmission device has a wavelength different from that of another exciting light used in the second transmission device.

14. A method of controlling an exciting light source outputting an exciting light, said method comprising the steps of:

determining whether a light received via a transmission line includes said exciting light; and controlling the exciting light source to stop outputting the exciting light when it is determined that the light received via the transmission line includes said exciting light.

15. A transmission device comprising:

an exciting light source outputting an exciting light;

a first optical part which supplies an optical amplifying part with a signal light and the exciting light;

a second optical part which supplies an amplified light to an optical transmission line and receives a light via the optical transmission line;

a control part which determines whether the light received by the second optical part includes the exciting light output by the exciting light source and controls the exciting light source to stop outputting the exciting light;

a first part which causes the exciting light source to generate a modulated light signal having a given pattern, when it is determined that the light received by the second optical part includes the exciting light, and determines whether the light received includes the modulated light signal having the given pattern; and a switch part which supplies the modulated signal to the optical transmission line without supplying the modulated light signal to the optical amplifier part, the first part causing the exciting light source to stop outputting any light when it is determined that the received light includes the modulated light signal having the given pattern.

16. A transmission device comprising:

an exciting light source outputting an exciting light;

a first optical part which supplies an optical amplifying part with a signal light and the exciting light;

a second optical part which supplies an amplified light to an optical transmission line and receives a light via the optical transmission line;

a control part which determines whether the light received by the second optical part includes the exciting light output by the exciting light source and controls the exciting light source to stop outputting the exciting light; and a multiplexer/demultiplexer part which inserts a given pattern into the signal light when it is determined that the light received by the second optical part includes the exciting light, and extracts the given pattern from the light received, said control part causing the exciting light source to stop outputting the exciting light, when the given pattern is extracted from the light received.

17. The transmission device as claimed in claim 15, wherein the first optical part is provided at an output side of the optical amplifying part, and supplies the exciting light from the exciting light source to the optical amplifying part and the optical transmission line.

18. The transmission device as claimed in claim 15, wherein said control part causes the signal light to stop being output to the optical transmission line.

19. The transmission device as claimed in claim 15, further comprising a multiplexer/demultiplexer part which inserts a given pattern into the signal light, when it is determined that the light received by the second optical part includes the exciting light, and extracts the given pattern from the light received, said control part causing the exciting light source to stop outputting the exciting light, when the given pattern is extracted from the light received.

20. The transmission device as claimed in claim 15, further comprising:

a first part which causes the exciting light source to vary a magnitude of the exciting light by changing a bias current flowing in the exciting light source, when it is determined that the light received by the second optical part includes the exciting light, and determines whether the light received includes the exciting light having a level corresponding to a varied magnitude, the first part causing the exciting light source to stop outputting any light, when it is determined that the light received includes the exciting light having the level corresponding to the varied magnitude.

21. The transmission device as claimed in claim 15, wherein said first optical part is provided at an input side of the optical amplifying part, and supplies the exciting light from the exciting light source to the optical amplifying part and the optical transmission line.

22. The transmission device as claimed in claim 15, wherein said first and second optical parts include respective optical directional couplers.

23. The transmission device as claimed in claim 15, wherein said first optical part includes an optical directional coupler, and the second part includes a wavelength division multiplexer.

24. The transmission device as claimed in claim 15, wherein the exciting light has a wavelength different from that of the signal light.

25. The transmission device as claimed in claim 16, wherein the first optical part is provided at an output side of the optical amplifying part, and supplies the exciting light from the exciting light source to the optical amplifying part and the optical transmission line.

26. The transmission device as claimed in claim 16, further comprising:

a first part which causes the exciting light source to generate a modulated light signal having a given pattern, when it is determined that the light received includes the exciting light, and determines whether the light received includes the modulated light signal having the given pattern; and a switch part which supplies the modulated signal to the optical transmission line without supplying the modulated light signal to the optical amplifier part, the first part causing the exciting light source to stop outputting any light, when it is determined that the received light includes the modulated light signal having the given pattern.

27. The transmission device as claimed in claim 16, wherein said control part causes the signal light to stop being output to the optical transmission line.

28. The transmission device as claimed in claim 16, further comprising:

a first part which causes the exciting light source to vary a magnitude of the exciting light by changing a bias current flowing in the exciting light source, when it is determined that the light received by the second optical part includes the exciting light, and determines whether the light received includes the exciting light having a level corresponding to a varied magnitude, the first part causing the exciting light source to stop outputting any light, when it is determined that the light received includes the exciting light having the level corresponding to the varied magnitude.

29. The transmission device as claimed in claim 16, wherein said first optical part is provided at an input side of the optical amplifying part, and supplies the exciting light from the exciting light source to the optical amplifying part and the optical transmission line.

30. The transmission device as claimed in claim 16, wherein said first and second optical parts include respective optical directional couplers.

31. The transmission device as claimed in claim 16, wherein said first optical part includes an optical directional coupler, and the second part includes a wavelength division multiplexer.

32. The transmission device as claimed in claim 16, wherein the exciting light has a wavelength different from that of the signal light.

* * * * *